(12) United States Patent  
Sakamoto et al.

(10) Patent No.: US 7,125,798 B2
(45) Date of Patent: Oct. 24, 2006

(54) CIRCUIT DEVICE AND MANUFACTURING METHOD OF CIRCUIT DEVICE

(75) Inventors: Noriaki Sakamoto, Gunma (JP); Yoshiyuki Kobayashi, Gunma (JP); Junji Sakamoto, Gunma (JP); Shigeaki Mashimo, Gunma (JP); Katsumi Okawa, Gunma (JP); Eiju Maehara, Gunma (JP); Kouji Takahashi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/372,414

(22) Filed: Feb. 24, 2003

(65) Prior Publication Data

US 2003/0151135 A1   Aug. 14, 2003

Related U.S. Application Data

(63) Continuation of application No. 09/671,135, filed on Sep. 27, 2000, now Pat. No. 6,548,328.

(30) Foreign Application Priority Data

| Jan. 31, 2000 | (JP) | ............................ 2000-022646 |
| Feb. 1, 2000 | (JP) | ............................ 2000-24047 |
| Feb. 9, 2000 | (JP) | ............................ 2000-32417 |
| Feb. 9, 2000 | (JP) | ............................ 2000-32454 |

(51) Int. Cl.
*H01L 21/44* (2006.01)
*H01L 21/48* (2006.01)
*H01L 21/50* (2006.01)

(52) U.S. Cl. .................... 438/666; 438/110; 438/124; 438/127; 438/109

(58) Field of Classification Search ........ 438/124–127, 438/110–112, 106, 107, 666, 108; 257/777, 257/723, 686
See application file for complete search history.

(56) References Cited

U.S. PATENT DOCUMENTS

| 5,122,860 | A | * | 6/1992 | Kikuchi et al. ............. 257/679 |
| 5,157,475 | A | * | 10/1992 | Yamaguchi ................. 257/784 |
| 5,216,278 | A | * | 6/1993 | Lin et al. .................... 257/688 |
| 5,239,198 | A | * | 8/1993 | Lin et al. .................... 257/693 |
| 5,273,938 | A | | 12/1993 | Lin et al. |
| 5,559,364 | A | | 9/1996 | Hojyo |
| 5,580,466 | A | | 12/1996 | Tada et al. |
| 5,606,201 | A | | 2/1997 | Lutz |
| 5,841,190 | A | | 11/1998 | Noda et al. |
| 5,976,912 | A | | 11/1999 | Fukutomi et al. |
| 6,001,671 | A | | 12/1999 | Fjelstad |
| 6,025,650 | A | | 2/2000 | Tsuji et al. |

(Continued)

FOREIGN PATENT DOCUMENTS

JP   2781018   8/1996

(Continued)

*Primary Examiner*—Nitin Parekh
(74) *Attorney, Agent, or Firm*—Fish & Richardson P.C.

(57) ABSTRACT

After a trench 54 is formed in a conductive foil 60, the circuit elements are mounted, and the insulating resin is applied on the conductive foil 60 as the support substrate. After being inverted, the conductive foil 60 is polished on the insulating resin 50 as the support substrate for separation into the conductive paths. Accordingly, it is possible to fabricate the circuit device in which the conductive paths 51 and the circuit elements 52 are supported by the insulating resin 50, without the use of the support substrate. And the interconnects L1 to L3 requisite for the circuit are formed, and can be prevented from slipping because of the curved structure 59 and a visor 58.

10 Claims, 16 Drawing Sheets

U.S. PATENT DOCUMENTS

| | | |
|---|---|---|
| 6,051,878 A | 4/2000 | Akram et al. |
| 6,063,139 A | 5/2000 | Fukaya |
| 6,137,164 A | 10/2000 | Yew et al. |
| 6,222,739 B1 | 4/2001 | Bhakta et al. |
| 6,228,676 B1 | 5/2001 | Glenn et al. |
| 6,255,740 B1 | 7/2001 | Tsuji et al. |
| 6,268,648 B1 * | 7/2001 | Fukutomi et al. ........... 257/678 |
| 6,353,258 B1 | 3/2002 | Inoue et al. |
| 6,362,525 B1 | 3/2002 | Rahim |
| 6,410,363 B1 | 6/2002 | Tani et al. |
| 6,451,627 B1 | 9/2002 | Coffman |
| 6,483,184 B1 * | 11/2002 | Murata ....................... 257/698 |
| 6,831,352 B1 | 12/2004 | Tsai |

FOREIGN PATENT DOCUMENTS

| | | |
|---|---|---|
| JP | 3061116 | 6/1999 |

* cited by examiner

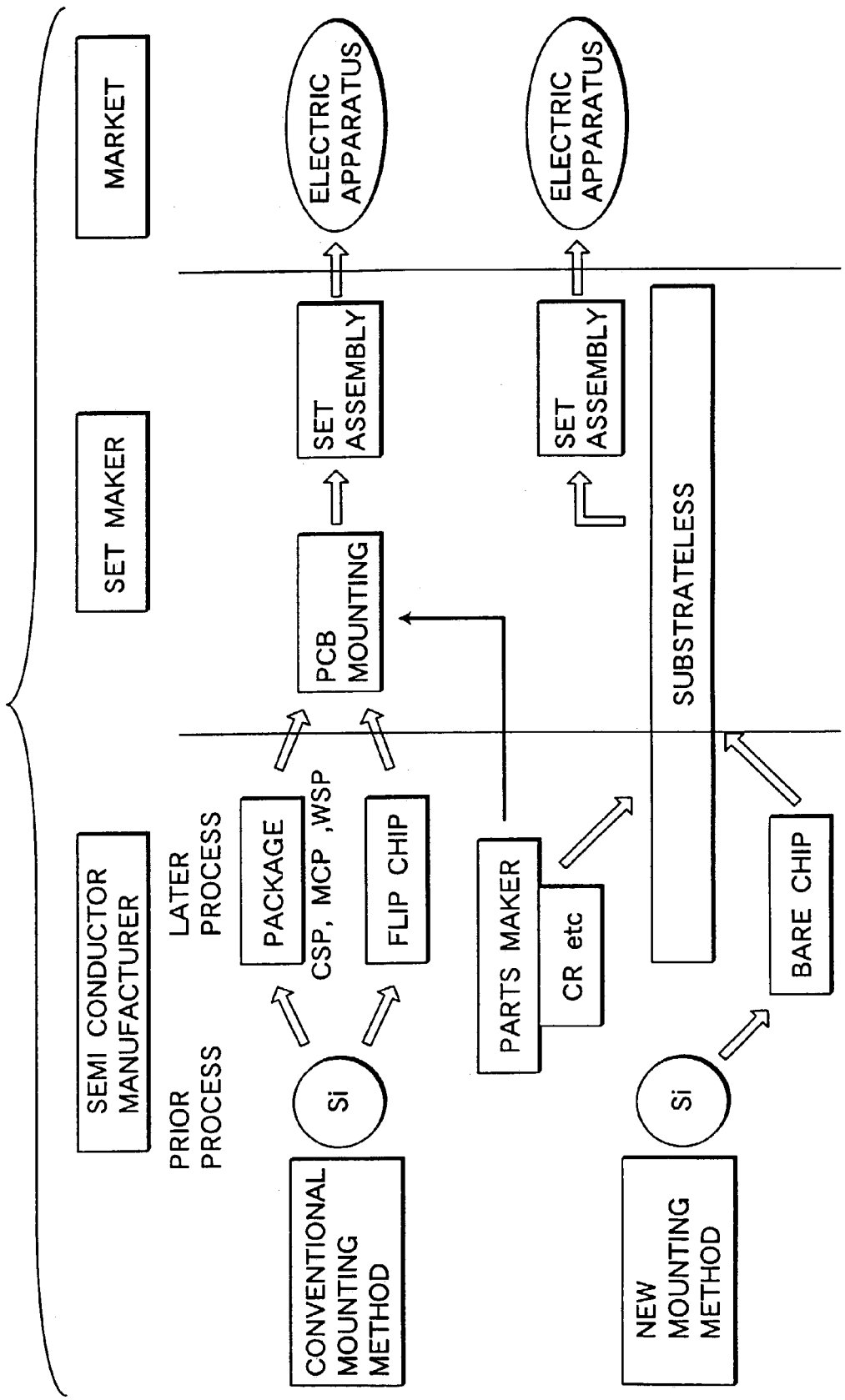

CIRCUIT DEVICE AND MANUFACTURING METHOD OF CIRCUIT DEVICE

This application is a continuation of U.S. application Ser. No. 09/671,135, filed Sep. 27, 2000 now U.S. Pat. No. 6,548,328, which in turn claims the benefit of foreign priority applications filed in Japan, serial number 2000-022646, filed Jan. 31, 2000, serial no. 2000-24047, filed Feb. 1, 2000, serial no. 2000-32417, filed Feb. 9, 2000, and serial no. 2000-32454, filed Feb. 9, 2000. All foregoing applications are incorporated herein by reference.

BACKGROUND OF THE INVENTION

1. Field of the Invention

The present invention relates to a circuit device and a method for manufacturing the circuit device, and more particularly to a thin-type circuit device and a method of manufacturing the thin-type circuit device without the need of providing a support substrate.

2. Description of the Related Art

Conventionally, it has been demanded that a circuit device which is set in an electronic apparatus is reduced in size, thickness and weight, because the circuit device is used for a portable telephone, a portable computer and so on.

For example, a semiconductor device as a circuit device is typically a package type semiconductor device which is conventionally sealed by normal transfer molding. This semiconductor device 1 is mounted on a printed circuit board PS as shown in FIG. 24.

This package type semiconductor device 1 has a semiconductor chip 2 covered with a resin layer 3, with a lead terminal 4 for external connection derived from the side of this resin layer 3.

However, this package type semiconductor device 1 had the lead terminal 4 out of the resin layer 3, and was too large in total size to meet smaller, thinner and lighter requirements.

Therefore, various companies have competed to develop a wide variety of structures which are reduced in size, thickness and weight. Recently, a wafer scale CSP which is as large as a chip size, called a CSP (Chip Size Package), or a CSP which is slightly larger than the chip size, has been developed.

FIG. 25 shows a CSP 6 which adopts a glass epoxy substrate 5 as a support substrate and which is slightly larger than a chip size. Herein, a transistor chip T is mounted on the glass epoxy substrate 5.

On the surface of this glass epoxy substrate 5, a first electrode 7, a second electrode 8 and a die pad 9 are formed, and on the back face, a first back electrode 10 and a second back electrode 11 are formed. Via a through hole TH, the first electrode 7 and the first back electrode 10, as well as the second electrode 8 and the second back electrode 11, are electrically connected. On the die pad 9, the bare transistor chip T is fixed. An emitter electrode of transistor and the first electrode 7 are connected via a bonding wire 12, and a base electrode of transistor and the second electrode 8 are connected via the bonding wire 12. Further, a resin layer 13 is provided on the glass epoxy substrate 5 to cover the transistor chip T.

The CSP 6 adopts the glass epoxy substrate 5, which has the merits of a simpler structure extending from the chip T to the back electrodes 10, 11 for external connection, and a less expensive cost of manufacture, than the wafer scale CSP.

The CSP 6 is mounted on the printed circuit board PS, as shown in FIG. 24. The printed circuit board PS is provided with the electrodes and wires making up an electric circuit, and has the CSP 6, the package type semiconductor device 1, a chip resistor CR and a chip capacitor CC fixed for the electrical connection.

A circuit on this printed circuit board is packaged in various sets.

Referring to FIGS. 26 and 27, a method for manufacturing this CSP will be described below. In FIG. 27, reference is made to a flow diagram entitled as a Glass epoxy/flexible substrate, listed in the middle.

Firstly, the glass epoxy substrate 5 is prepared as a base material (support substrate). On both sides of the glass epoxy substrate 5, the Cu foils 20, 21 are applied via an insulating adhesive (see FIG. 26A).

Subsequently, the Cu foils 20, 21 corresponding to the first electrode 7, the second electrode 8, the die pad 9, the first back electrode 10 and the second back electrode 11 are coated with an etching resist 22 and patterned. Note that the patterning may be made separately on the front face and the back face (see FIG. 26B).

Then, using a drill or a laser, a bore for the through hole TH is opened in the glass epoxy substrate. This bore is plated to form the through hole TH. Via this through hole TH, the electrical connection between the first electrode 7 and the first back electrode 10 and between the second electrode 8 and the second back electrode 10 is made (see FIG. 26C).

Further, though being not shown in the figure, the first electrode 7 and the second electrode 8 which become the bonding posts are subjected to Ni plating or Au plating, and the die pad 9 which becomes a die bonding post is subjected to Au plating to effect die bonding of the transistor chip T.

Lastly, the emitter electrode of the transistor chip T and the first electrode 7, and the base electrode of the transistor chip T and the second electrode 8 are connected via the bonding wire 12, and covered with the resin layer 13 (see FIG. 26D).

As required, individual electrical elements are formed by dicing. In FIG. 26, only one transistor chip T is provided on the glass epoxy substrate 5, but in practice, a matrix of transistor chips T are provided. Accordingly, a dicing apparatus separates them into individual elements.

In accordance with the above manufacturing method, a CSP type electrical element using the support substrate 5 can be completed. This manufacturing method is also effected with the use of a flexible sheet as the support substrate.

On the other hand, a manufacturing method adopting a ceramic substrate is shown in a flow diagram to the left in FIG. 27. After the ceramic substrate which is the support substrate is prepared, the through holes are formed. Then using a conductive paste, the electrodes are printed and sintered on the front face and the back face. Thereafter, the same manufacturing method of FIG. 26, up to coating the resin layer is followed, but since the ceramic substrate is very fragile, and is likely to break off, unlike a flexible sheet or the glass epoxy substrate, there is a problem with the difficulty of molding using die. Therefore, a sealing resin is potted and cured, then polished for the uniform treatment of the face of the sealing resin. Lastly, using the dicing apparatus, individual devices are made.

In FIG. 25, the transistor chip T, connecting means 7 to 12, and the resin layer 13 are requisite components for the electrical connection with the outside, and the protection of transistor. However, only these components were difficult to provide an electrical circuit device reduced in size, thickness and weight.

Essentially, there is no need of having the glass epoxy substrate 5 which becomes the support substrate, as described before. However, since the manufacturing method involves pasting the electrode on the substrate, the support substrate is required, and this glass epoxy substrate 5 could not be dispensed with.

Accordingly, the use of this glass epoxy substrate 5 raised the cost. Further, since the glass epoxy substrate 5 was thick, the circuit device was thick, limiting the possibility to reduce the size, thickness and weight of the device.

Further, the glass epoxy substrate or the ceramic substrate necessarily requires a through hole forming process for connecting the electrodes on both sides. Hence, there was a problem with the long manufacturing process.

FIG. 28 shows a pattern diagram on the glass epoxy substrate, the ceramic substrate or a metal substrate. On this pattern, an IC circuit is typically made, with a transistor chip 21, an IC chip 22, a chip capacitor 23 and/or a chip resistor 24 mounted. Around this transistor chip 21 or the IC chip 22, a bonding pad 26 integral with a wire 25 is formed to electrically connect the chips 21, 22 via a bonding wire 28. A wire 29 is made integrally with an external lead pad 30. These wires 25, 29 are bent through the substrate, and made slender in the IC circuit, as necessary. Accordingly, this slender wire has smaller contact area with the substrate, leading to exfoliation or curvature of the wire. The bonding pad 26 is classified into a bonding pad for power and a bonding pad for small signal. Particularly, the bonding pad for small signal has a small bonding area, which caused a film exfoliation.

Further, an external lead is fixed to an external lead pad 30. There was a problem that the external lead pad 30 might be exfoliated due to an external force applied to the external lead.

SUNMMARY OF THE INVENTION

The present invention intends to obtain a semiconductor device which is easy to be manufactured, and has a high accuracy and reliability.

The present invention has been achieved in the light of the above-mentioned problems, and its object is to provide a circuit device, comprising:

a plurality of conductive paths;

a circuit element mounted on said desired conductive paths; and a package of an insulating resin for coating said circuit element and supporting integrally said conductive paths;

a plurality of lead terminals for connecting with outer circuit, the lead terminals being exposed from one surface of the package Preferably, the conductive paths are made of pressed metal.

In the present invention, since a plate like body is used as a conductive plate for forming conductive path pattern and an isolation trench is formed by half punching or half etching to form conductive paths, conductive paths whose sheet resistance is very low, whose pattern is fine and whose surface is very flat, can be obtained.

Therefore, bonding reliability is very high and in the case of mounting a high-integrated semiconductor circuit, high accuracy and reliability in the high-integrated semiconductor circuit device can be realized.

According to using a pressed metal as a conductive plate, boundaries are positioned at random, thereby sheet resistance is low and fine and very flat conductive paths in microscopic views can be obtained.

In the case that plating film whose thickness is formed so thick as to be able to use as conductive paths, film thickness is deviated and a sufficient flatness cannot be obtained. For example, when a plating film whose thickness is 20–100 μm is formed, it is difficult to have an uniform thickness of the plating film. Therefore bonding strength is lowered.

Contrary that, in the case if conductive paths formed by half etching a pressed metal such as copper foil, the surface of the conductive paths is very flat and bonding accuracy and bonding reliability are very high.

In the plating film, according to using a mirror polished surface of a substrate as a growth starting face of plating, then removing the substrate and using the growth starting face as a bonding face, flatness of the bonding surface is slightly improved. However accuracy in the case is inferior to use the pressed metal such as cooper.

Further according to the above structure, the present invention has following advantages. The semiconductor device of the present invention can be enduring a stress caused by a warp of a thin type package. Further an electrical connecting portion can be prevented from being polluted. Since rigidity is improved, operation efficiency can be improved.

For example, by using a pressed metal including a Fe—Ni alloy as a main component, as the conductive path, thermal expansion coefficient can be prevented from mis-matching, since thermal expansion coefficient of the silicon chip is near to that of the Fe—Ni alloy.

Further, by using a pressed metal including Al as a main component, the device becomes lighter than that using a pressed metal including Cu or Fe—Ni as a main component. In this case, without forming a plating film, direct bonding can be conducted with using an Al wiring or Au wiring.

Since the conductive path is made of a material whose crystal boundary is disposed at random so that a surface of the conductive path is flat, endurance against bending or rigidity can be improved and a deterioration of the conductive path.

Further a surface on which circuit element is to be formed is covered with a conductive film made of metal material different from a material of the conductive path. Therefore warp or wire breaks of the conductive path caused by a stress, and reliability of connecting portion between a die-bonding portion and an element. Further according to using the conductive film made of Ni plating film, wire bonding using Al wire can be conducted and formation of a visor (projected portion) can be formed.

Further, for example, the present invention has been achieved in the light of the above-mentioned problems, and its object is to provide a circuit device, comprising:

a plurality of conductive paths which are electrically isolated;

a plurality of circuit elements fixed on said desired conductive paths; and an insulating resin for coating said circuit elements and supporting integrally said conductive paths;

wherein at least one of the plurality of said conductive paths is used for an interconnect to electrically connect the plurality of said circuit elements, and has a curved lateral face (side surface) to be fitted with said insulating resin. The present invention can resolve the above conventional problems with the minimum number of components, the conductive path being prevented from slipping off the insulating resin.

According to a second aspect of the invention, there is provided a circuit device, comprising:

a plurality of conductive paths which are electrically isolated by a trench;

a plurality of circuit elements fixed on said desired conductive paths; and an insulating resin for coating said circuit elements and supporting integrally said conductive paths by being filled into said trench between said conductive paths;

wherein at least one of the plurality of said conductive paths is used for an interconnect to electrically connect the plurality of said circuit elements, and has a curved lateral face to be fitted with said insulating resin. The present invention can resolve the above conventional problems in such a way that the insulating resin filled into the trench supports the conductive path integrally to prevent slippage of the conductive path.

According to a third aspect of the invention, there is provided a circuit device, comprising:

a plurality of conductive paths which are electrically isolated by a trench;

a plurality of circuit elements fixed on said desired conductive paths; and an insulating resin for coating said circuit elements and supporting integrally said conductive paths by being filled into said trench between said conductive paths, with the back face of said conductive paths exposed;

wherein at least one of the plurality of said conductive paths is used for an interconnect to electrically connect the plurality of said circuit elements, and has a curved lateral face to be fitted with said insulating resin. The present invention can resolve the above conventional problems in such a way that the back face of conductive path is utilized as an electrode for external connection, to prevent slippage of the conductive path, while the through hole can be also dispensed with.

According to a fourth aspect of the invention, there is provided a manufacturing method for a circuit device comprising the steps of:

forming the conductive paths having a curved lateral face by preparing a conductive foil, and forming a trench having a smaller depth than the thickness of said conductive foil on said conductive foil excluding at least a region which becomes a conductive path;

fixing a plurality of circuit elements on said desired conductive paths;

coating and molding said circuit elements with an insulating resin to be filled into said trench for fitting said conductive paths with said insulating resin; and forming a circuit by removing said conductive foil at a portion of thickness where said trench is not provided, to enable an interconnect formed of a part of said conductive path to be electrically connected with said plurality of circuit elements. The present invention can resolve the above conventional problems in such a way that the conductive foil for forming the conductive paths is a starting material, and the conductive foil has a supporting function till the insulating resin is molded, and the insulating resin has the supporting function after molding. There is no need of providing the support substrate.

According to a fifth aspect of the invention, there is provided a manufacturing method for a circuit device comprising the steps of:

forming the conductive paths having a curved lateral face by preparing a conductive foil, and forming a trench having a smaller depth than the thickness of said conductive foil on said conductive foil excluding at least a region which becomes a conductive path;

fixing a plurality of circuit elements on said desired conductive paths;

providing connecting means for electrically connecting an electrode of said circuit element with desired one of said conductive paths;

coating and molding said circuit elements with an insulating resin to be filled into said trench for fitting said conductive paths with said insulating resin;

forming a circuit by removing uniformly said conductive foil at a portion of thickness where said trench is not provided from the back side and making the back face of said conductive paths and said insulating resin across said trench a substantially flat surface, to enable an interconnect formed of a part of said conductive path to be electrically connected with said plurality of circuit elements. The present invention can resolve the above conventional problems in such a way as to have bonding which is prevented from slipping and form a flat circuit device.

BRIEF DESCRIPTION OF THE DRAWINGS

FIG. 29 is a diagram for explaining the relation between the semiconductor manufacturer and the set maker.

DESCRIPTION OF THE PREFERRED EMBODIMENTS

First Embodiment for Circuit Device

Figure 1A:
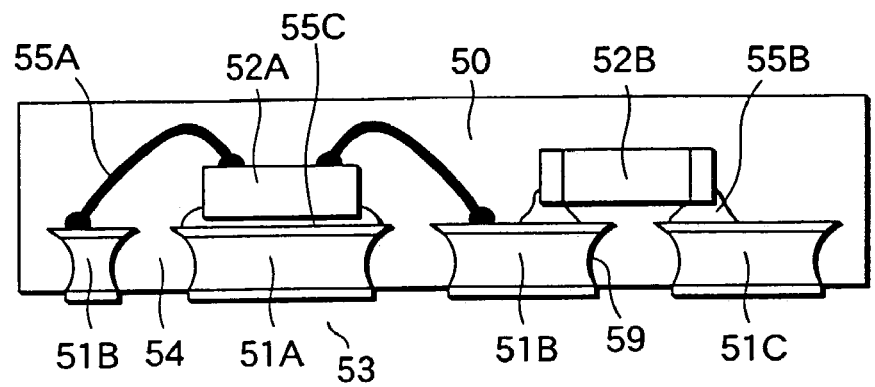
FIG. 1 is a view for explaining a circuit device according to the present invention.

Referring to FIG. 1, a circuit device of the present invention will be first described below in connection with its structure.

FIG. 1 shows a circuit device 53 in which a conductive path 51 is buried into an insulating resin 50, and a circuit device 52 is fixed on said conductive path 51 supported by the insulating resin 50. The lateral face of the conductive path 51 has a curved structure 59.

This circuit device is mainly composed of the circuit elements 52A, 52B, a plurality of conductive paths 51A, 51B and 51C, and the insulating resin 50 into which the conductive paths 51A, 51B and 51C are buried. Between the conductive paths 51, a trench 54 is filled with the insulating resin 50. And the insulating resin 50 supports the conductive paths 51 of the curved structure 59.

The insulating resin may be a thermosetting resin, such as epoxy resin, or a thermoplastic resin, such as polyimide resin and polyphenylene sulfide. Also, the insulating resin may be any of the resins as far as they can be set by the use of a molding die, or coated by dipping or application (coating). Further resin including fiber called as Pre-preg is also applicable. The conductive path 51 may be a conductive foil composed of Cu as the main substance, a conductive foil composed of Al as the main constituent, or a conductive foil composed of an alloy of Fe—Ni. Other electrically conductive materials may be of course usable. A conductive material which can be etched or evaporate by laser is preferable.

In the present invention, the dry etching or wet etching is used for the non-anisotropic (isotropic) etching to have the lateral face of the conductive path 51 curved, bringing about the anchor effect.

Therefore, the conductive path 51 is prevented from slipping off the insulating resin 50.

Connecting means for the circuit elements 52 may be a bonding wire 55A, a conductive ball made of brazing material, an oblate conductive ball, a brazing material 55B such as solder, a conductive paste 55C such as Ag paste, a conductive coat, or an anisotropic conductive resin. These connecting means may be selected depending on the kind of the circuit element 52, and the mounting mode of the circuit element 52. For example, for the bare semiconductor element, a bonding wire is selected to connect the electrode on the surface of the electrode and the conductive path 51. For the CSP, a solder ball or solder bump is selected. For the chip resistor or chip capacitor, the solder 55B is selected. The circuit element packaged, for example, a BGA, can be mounted in the conductive path 51 without causing any problem, in which the connecting means may be solder.

To fix the circuit element 52A with the conductive path 51A, an insulating adhesive is selected if the electrical connection is unnecessary. If the electrical connection is required, the conductive coat is adopted. Herein, at least one layer of conductive coat may be required.

The conductive coat materials may be Ag, Au, Pt or Pd, which is coated by evaporation, sputtering or CVD under low vacuum or high vacuum, plating, or sintering.

For example, Ag is adherent to Au, as well as the brazing material. Hence, if an Au coat is applied on the back face of the chip, the chip can be directly subjected to thermocompression bonding with an Ag coat, Au coat or solder coat on the conductive path 51A, or the chip can be fixed via the brazing material such as solder. Herein, such conductive coat may be formed on the uppermost layer of the conductive coats laminated. For example, on the conductive path 51A of Cu, two layers of Ni coat and Au coat may be applied in due order, three layers of Ni coat, Cu coat and solder coat applied in due order, or two layers of Ag coat and Ni coat applied in due order. Note that a number of other kinds of conductive coat or lamination structures are considered, but omitted here.

This circuit device has the insulating resin 50 which is a sealing resin to support the conductive paths 51. Therefore, the circuit device has no need of the support substrate, and is constituted of the conductive paths 51, the circuit elements 52 and the insulating resin 50. This constitution is a feature of the present invention. As described previously in the paragraph of Related Art, the conductive paths of the conventional circuit device are supported by the support substrate, or the lead frame, which is not required in the intrinsic constitution. However, this circuit device is composed of as many constitutional elements as needed, without the need of the support substrate. As a result, this circuit device becomes a thin structure with the inexpensive cost.

In addition to the constitution as described previously, this circuit device has the insulating resin 50 for covering the conductive path 51 and filled into the trench 54 between the conductive paths 51 to support them integrally.

The interval between these conductive paths 51 with the curved structure 59 is the trench 54 where the insulating resin 50 is filled, and has the merit of effecting insulation between the conductive paths 51, while preventing the conductive paths 51 from slipping from the insulating resin 50.

This circuit device has the insulating resin 50 for covering the circuit elements 52 to be filled into the trench 54 between the conductive paths 51, and supporting the conductive paths integrally with the back face of the conductive paths 51 exposed.

A point of exposing the back face of the conductive paths is characteristic of the present invention. The back face of the conductive paths can be connected with the external. Hence, there is a feature that the conventional through hole TH of FIG. 25 can be dispensed with.

In the case where the circuit elements are directly fixed via the conductive coat made of brazing material, Au, or Ag, the heat developed by the conductive element 52A can be transferred to the mounting substrate via the conductive path 51A because the back face of the conductive paths 51 is exposed. Particularly by heat release, this circuit device is effective for the semiconductor chips which can improve the characteristics such as increased drive current.

Figure 25:
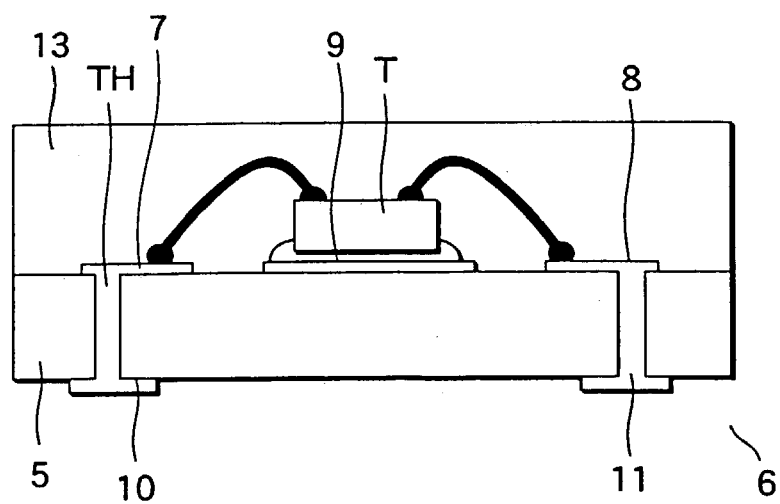
FIG. 25 is a view for explaining the conventional circuit device.
Figure 26A:
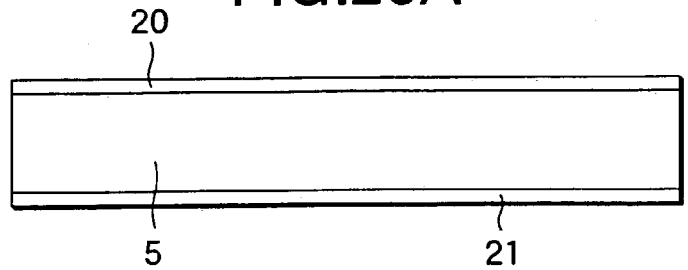
FIG. 26 is a view for explaining a method for manufacturing the conventional circuit device.
Figure 26B:
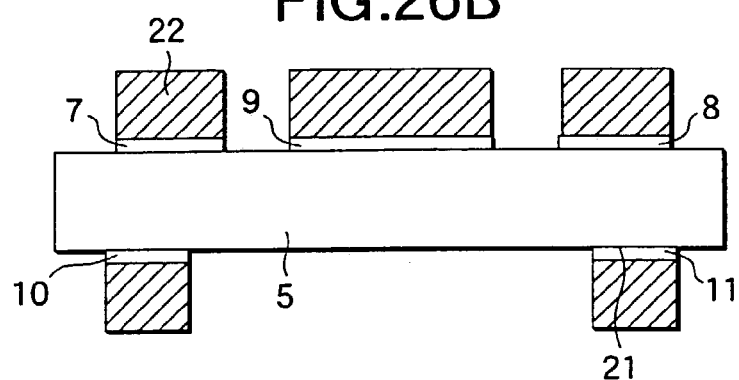
Figure 26C:
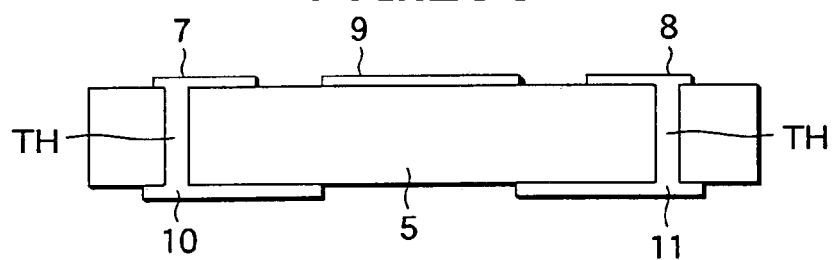
Figure 26D:
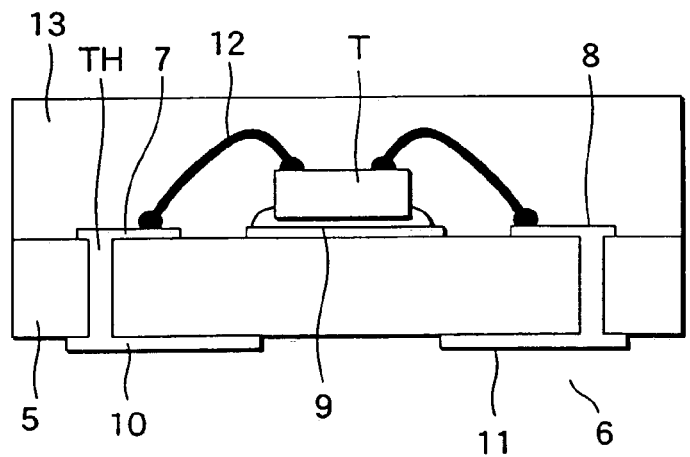

This circuit device has a substantially common surface for the trench 54 and the conductive paths 51. This structure of common surface is a feature of the present invention in that the circuit device 53 can be moved horizontally because there is no step between the back electrodes 10, 11 as shown in FIG. 25.

Figure 1B:
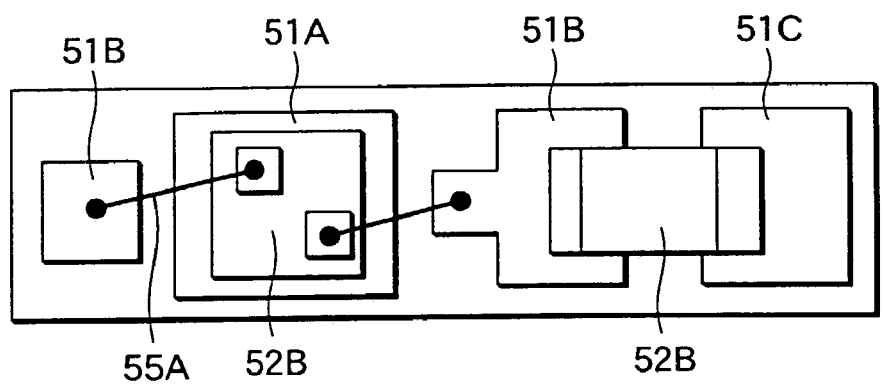
Figure 28:
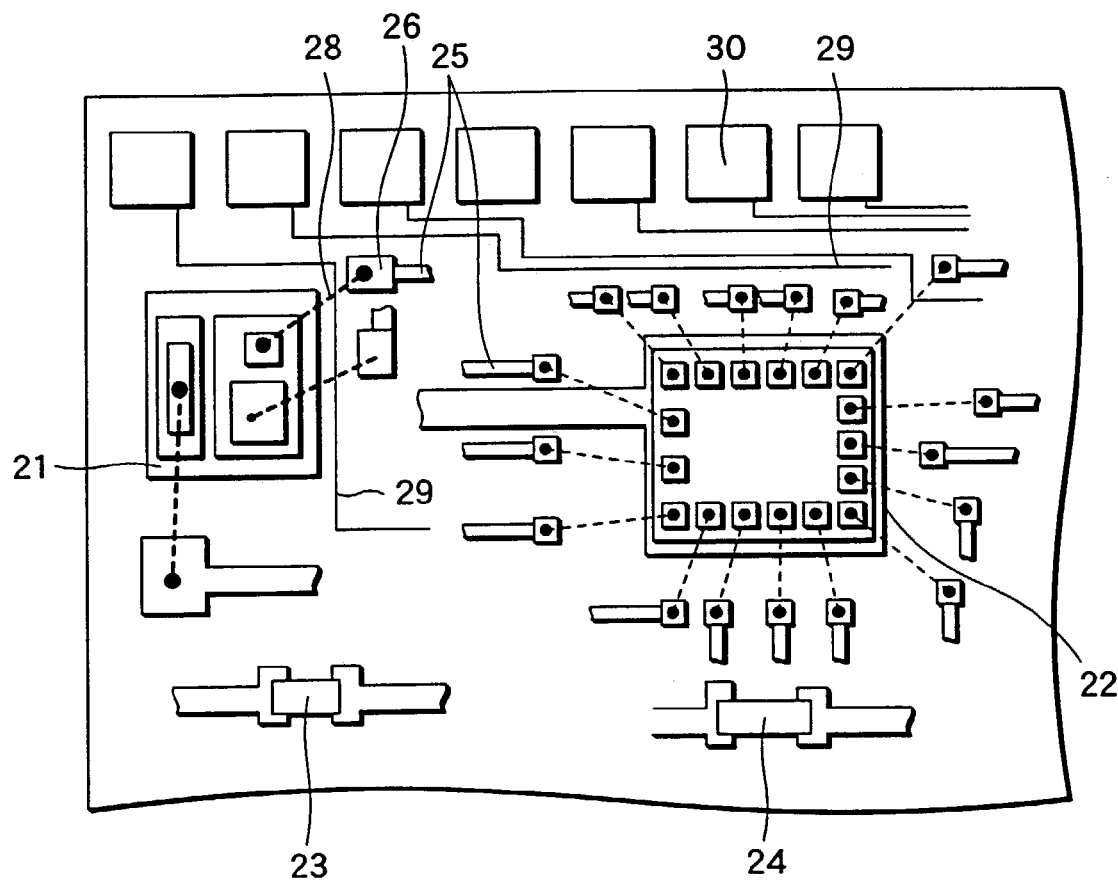
FIG. 28 is a pattern diagram of an IC circuit which is applicable to the conventional circuit device and the circuit device of the invention.

In FIG. 1, a plurality of circuit elements constitute an IC circuit, and the conductive paths for connection between the circuit elements are wired, with a land configuration as shown in FIG. 1B. However, the practical configuration is more complex as shown in FIGS. 2 and 28.

Figure 1C:
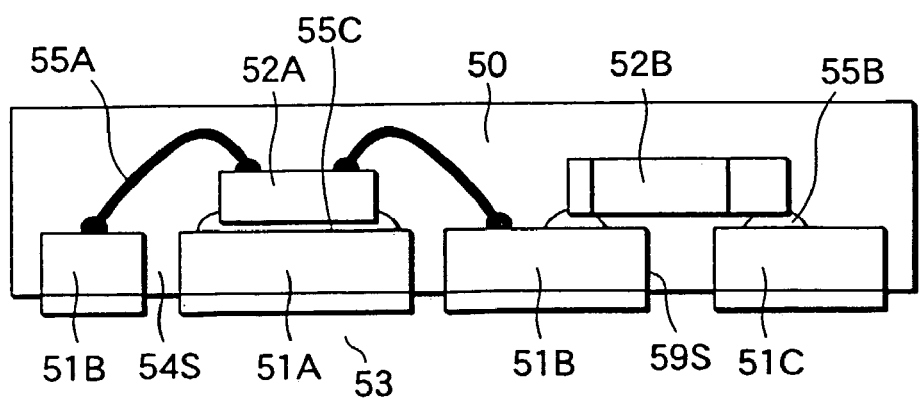

Further as an another arrangement of the first embodiment, as shown in FIG. 1C, the interval between these conductive paths 51 with a straight structure 59S can be a trench 54s where the insulating resin 50 is filled, and has the merit of effecting insulation between the conductive paths 51 as the device such as the first embodiment. An advantage of preventing the conductive paths 51 from slipping from the insulating resin 50 in the arrangement of the embodiment is slightly smaller than that of the first embodiment.

Second Embodiment for Circuit Device

A circuit device 53 of FIG. 2 will be described below.

This circuit device has substantially the same structure as that of FIG. 1, except that the interconnects L1 and L2 are formed as the conductive paths 51. Accordingly, the interconnects L1 and L2 will be described below.

As described before, there are a wide variety of IC circuits from a small-scale circuit to a large-scale circuit. For the convenience of the drawings, the small-scale circuit is only shown in FIG. 2A. This circuit is most applicable to an audio amplifying circuit having a difference amplifying circuit and a current mirror circuit connected. The difference amplifying circuit is constituted of a TR1 and a TR2, and the current mirror circuit is constituted of a TR3 and a TR4, as shown in FIG. 2A.

Figure 2A:
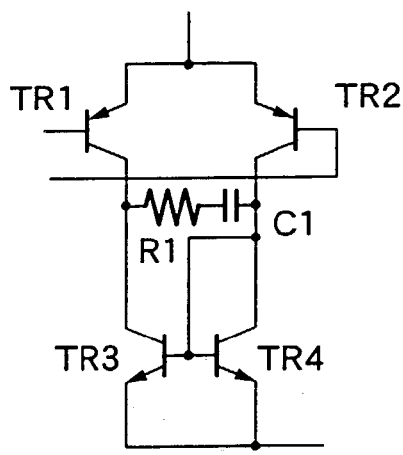
FIG. 2 is a view for explaining the circuit device of the invention.
Figure 2B:
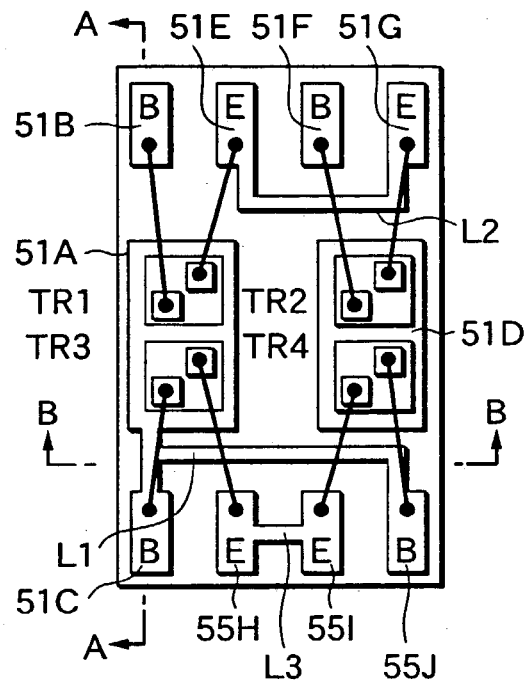
Figure 2C:
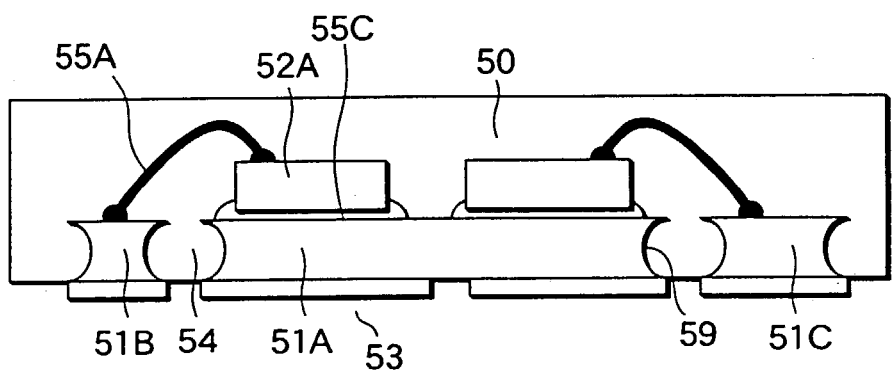
Figure 2D:
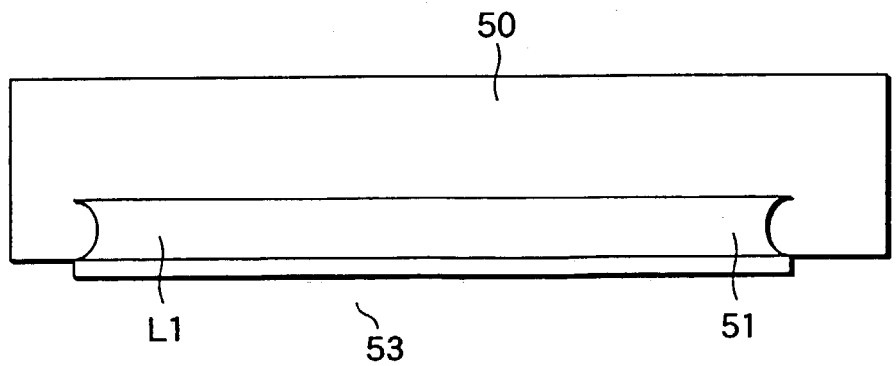

FIG. 2B is a plan view of the circuit device to which the circuit of FIG. 2A is applied. FIG. 2C is a cross-sectional view taken along the line A—A in FIG. 2B. FIG. 2D is a cross-sectional view taken along the line B—B. To the left of FIG. 2B, a die pad 51A for mounting the TR1 and TR3 is provided. To the right of FIG. 2B, a die pad 51D for mounting the TR2 and TR4 is provided. On the upper side of the die pads 51A, 51D, there are provided the electrodes for external connection 51B, 51E to 51G, and on the lower side thereof, there are provided the electrodes for external connection 51C, 51H to 51J. Since a TR1 emitter and a TR2 emitter are commonly connected, an interconnect L2 is formed integrally with the electrodes 51E, 51G. Also, since a TR3 base and a TR4 base, as well as a TR3 emitter and a TR4 emitter are commonly connected, an interconnect L1 is formed integrally with the electrodes 51C, 55J, and an interconnect L3 is formed integrally with the electrodes 55H, 55I.

The present invention has a feature of the interconnects L1 to L3. They correspond to the interconnects 25 and 29 in FIG. 28. These interconnects are different depending on the degree of integration of this circuit device, and have the width as narrow as 25 μm or more. Note that this width of 25 μm is a numerical value taken when the wet etching is used. If the dry etching is used, its width can be narrower.

As will be clear from FIG. 2D, a conductive path L1 constituting the interconnect L1 simply has the back face exposed, and has a lateral face of curved structure which is supported by the insulating resin 50. In other words, the interconnect is buried into the insulating resin 50. Hence, the wires can be prevented from slipping or warping, unlike the wires simply pasted on the support substrate as shown in FIG. 25. Particularly, since the lateral face of the first conductive path is a rough face with curved structure, and the visor is formed on the surface of the conductive path, there occurs an anchor effect to prevent the conductive path from slipping off the insulating resin, as will be understood from a manufacturing method hereinafter described.

The electrodes 51B, 51C, 551E to 51J for external connection are buried into the insulating resin, as described previously. Therefore, even if an external force is applied via an external lead secured therein, the electrodes are unlikely to be peeled.

Third Embodiment for Circuit Device

Figure 8:
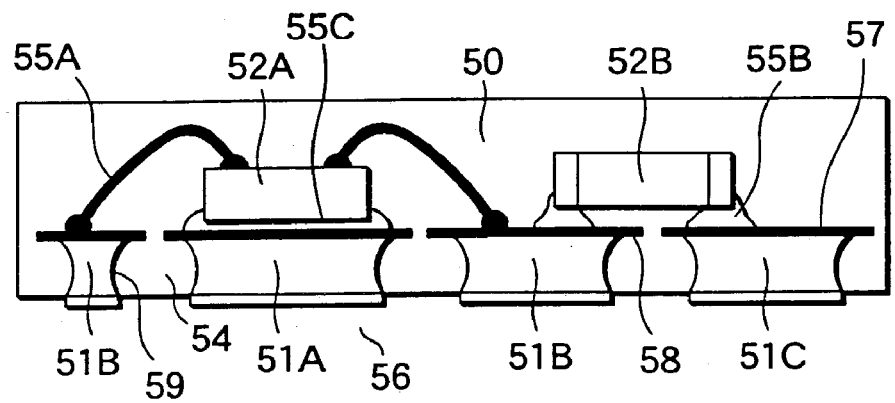
FIG. 8 is a view for explaining the circuit device of the invention.

A circuit device 56 of FIG. 8 will be described below.

This circuit device has substantially the same structure of FIG. 1 or 2, except that a conductive coat 57 is formed on the surface of the conductive paths 51. Herein, the conductive coat 57 on the conductive paths will be mainly described below.

A first feature is to provide the conductive coat 57 to prevent the circuit device or the conductive path 51 from warping.

Typically, due to a difference in thermal expansion coefficient between the insulating resin and the conductive path material (hereinafter referred to as a first material) the circuit device itself may be warped, or the conductive path curved or peeled. Since the thermal conductivity of the conductive paths 51 is superior to that of the insulating resin, the conductive paths 51 will rise in temperature more rapidly, and expand. A second material having a smaller thermal expansion coefficient than the first material is coated. Thereby, it is possible to prevent the curvature or exfoliation of the conductive paths, and the warpage of the circuit device. Particularly, when the first material is Cu, the second material is preferably Au, Ni or Pt. Cu has an expansion coefficient of Cu is $16.7 \times 10-6$ (10 to the minus 6th power), Au $14 \times 10-6$, Ni $12.8 \times 10-6$, and Pt $8.9 \times 10-6$. In this case, a plurality of layers may be formed.

A second feature is to provide an anchor effect based on the second material. A visor 58, which is formed of the second material, is formed over the conductive path 51 to be buried into the insulating resin 50, bringing about the anchor effect to prevent the slippage of the conductive paths 51. The visor 58 can be formed by the conductive path itself.

In the present invention, both the curved structure 59 and the visor 58 develops the double anchor effect to suppress the slippage of the conductive paths 51.

Figure 21:
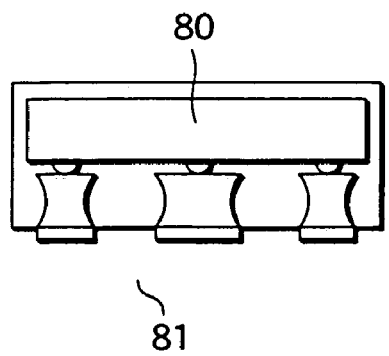
FIG. 21 is a view for explaining a circuit device of the invention.
Figure 22:
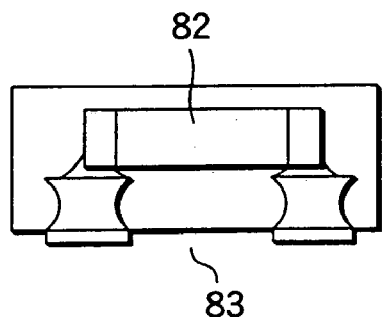
FIG. 22 is a view for explaining a circuit device of the invention.

In the above three embodiments, there has been described the circuit device having a transistor chip 52A and a passive element 52B mounted. However, the present invention is also applicable to a circuit device which is constituted of one semiconductor device sealed therein, as shown in FIGS. 21 and 22. FIG. 21 shows a circuit device 81 in which a face down element 80 such as a CSP is mounted. FIG. 22 shows a circuit device 83 in which the passive element 82 such as a chip resistor or chip capacitor is sealed. Further, the bonding wire may be provided between two conductive paths and sealed therein. This is usable as a fuse.

First Embodiment for a Manufacturing Method of a Circuit Device

Referring to FIGS. 3 to 7 and FIG. 1, a manufacturing method of a circuit device 53 will be described below.

Firstly, a sheet conductive foil 60 is prepared. This conductive foil 60 is composed of a material which is selected in consideration of the adhesive property to the brazing material, bonding property and plating property. Specifically, the material may be Cu or Al as the main constituent, or an alloy of Fe—Ni. Further lamination plate of Cu and Al is applicable. The conductive foil is preferably about 10 μm to 300 μm thick in view of the etching that is performed later. Herein, a copper foil having a thickness of 70 µm (2 ounces) is used. However, the thickness may be fundamentally over 300 µm or less than 10 µm. It is sufficient that the trench 61 which has a smaller depth than the thickness of the conductive foil 60 may be formed, as will be described later.

The sheet laminated conductive foil 60 is rolled in a desired width, and may be carried to each process as will be described later, or may be cut in a predetermined size, the cut conductive foils being carried to each process.

Subsequently, there are a step of removing the conductive foil 60, except for at least a region which becomes the conductive paths 51, below a thickness of the conductive foil 60, a step of mounting the circuit elements 52 on the conductive paths 60, and a step of coating the insulating resin 50 in the trench 61 formed at the step of removing and the conductive foil 60 to seal the circuit elements.

Figure 4:
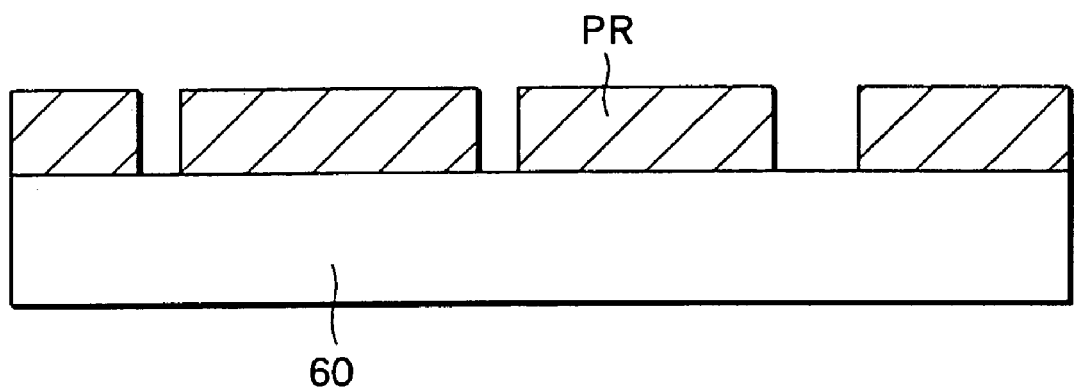
FIG. 4 is a view for explaining the method for manufacturing the circuit device of the invention.
Figure 5A:
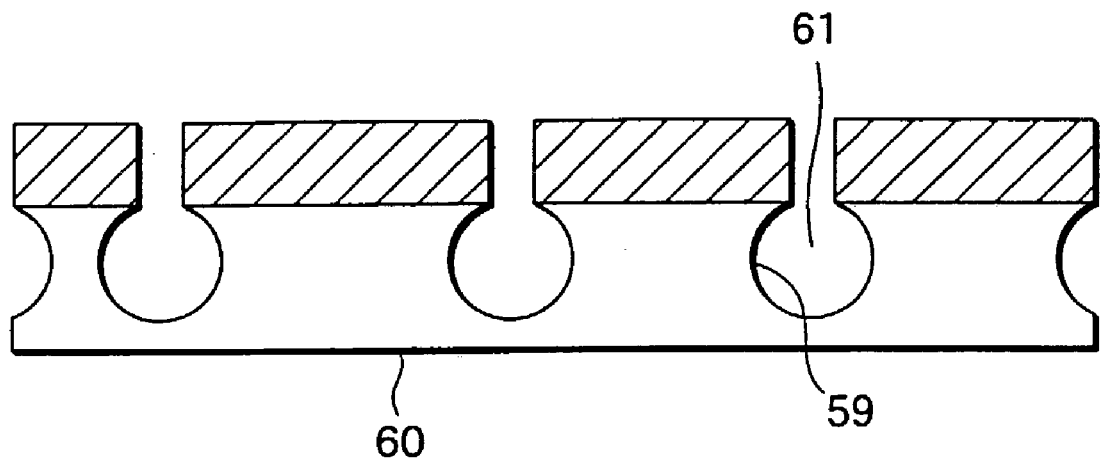
FIG. 5 is a view for explaining the method for manufacturing the circuit device of the invention.

Firstly, a photo-resist (PR) (etching resistant mask) is applied on the conductive foil 60 of Cu, and patterned to expose the conductive foil 60 excluding the region which becomes the conductive paths 51, as shown in FIG. 4. And etching is performed via the photo-resist PR, as shown in FIG. 5A.

This manufacturing method has a feature that the wet etching or dry etching can be performed non-anisotropically by selecting the etching condition. Then the lateral face (side surface) is a rough face and curved. Note that the depth of the trench 61 formed by etching is about 50–70 µm.

In the wet etching, etchant may be ferric chloride or cupric chloride. The conductive foil may be dipped in this etchant, or this etchant may be showered.

Figure 5B:
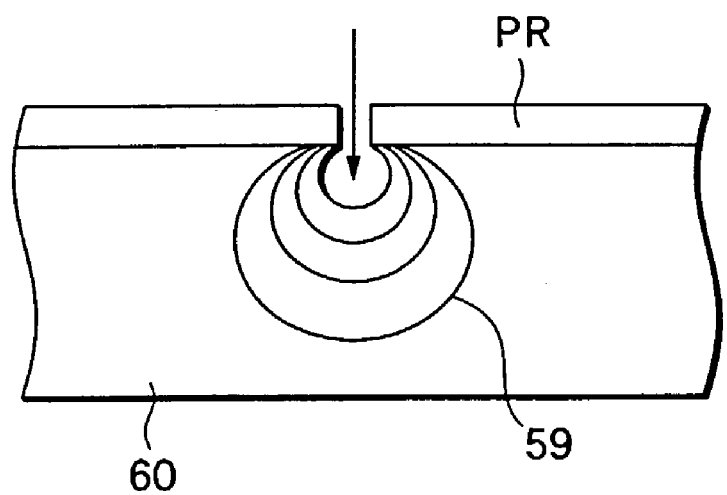

Particularly as shown in FIG. 5B, etching in the transversal direction is difficult to proceed directly under the photo-resist PR as the etching mask, but is gradually made in a deeper portion of the trench 61 in the transversal direction. As shown in the figure, with reference to a certain position on the lateral face of the trench 61, the size of aperture corresponding to its position is smaller with increased height, to taper inversely, resulting in the anchor structure. By showering, the etching proceeds in the depth direction, but is suppressed in the transversal direction, so that this anchor structure becomes remarkable.

In the dry etching, the orientation-dependent (anisotoropic) etching or non-anisotropic etching can be made. At present, it is said that Cu can not be removed by reactive ion etching. Cu can be removed by sputtering. The orientation-dependent etching or non-anisotropic etching can be effected, depending on the sputtering or etching conditions.

In FIG. 5, a conductive material which is resistant to the etching liquid may be selectively coated, instead of the photo-resist. By coating selectively this conductive material on a portion serving as the conductive path, this conductive material becomes an etching protective film, so that the trench can be etched without the use of the photo resist PR. The conductive materials may include Ag, Au, Pt, Pd or N. These corrosion resistant conductive materials have a feature of being readily available as the die pad or bonding pad.

For example, Ag can be bonded with Au and the brazing material. Hence, if Au has been coated on the back face of chip, the thermocompression bonding of chip can be effected with the Ag on the conductive coat 51, or the chip can be fixed via the brazing material such as solder. Since the Au bonding wire can be bonded to the conductive coat of Ag, the wire bonding is allowed. Accordingly, there is provided a merit that these conductive coats can be directly utilized as the die pad and the bonding pad.

Figure 6:
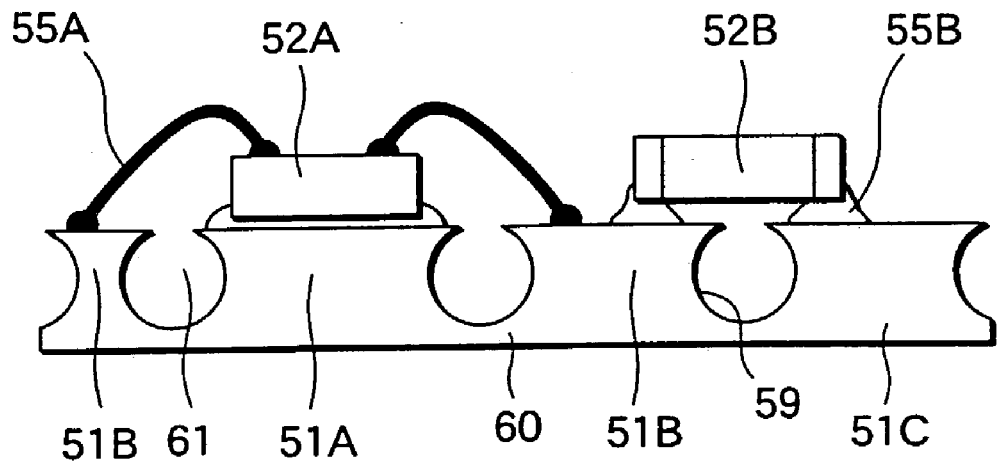
FIG. 6 is a view for explaining the method for manufacturing the circuit device of the invention.

Subsequently, there is a step of connecting electrically the circuit elements 52 to the conductive foil 60 formed with the trench 61, as shown in FIG. 6.

The circuit elements 52 include the semiconductor device 52A such as a transistor, a diode and an IC chip, and the passive element 52B such as a chip capacitor and a chip resistor. Though being thick, a face down semiconductor device such as CSP or BGA can be mounted.

Herein, the bare transistor chip 52A is die bonded to the conductive path 51A. Also, the emitter electrode and the conductive path 51B, as well the base electrode and the conductive path 51B, are connected via the bonding wire 55A which has been fixed by ball bonding with thermocompression, or wedge bonding with ultrasonic wave. The chip capacitor or the passive element 52B is fixed via the brazing material such as solder or the conductive paste 55B.

When the pattern of FIG. 28 is applied in this embodiment, the bonding pad 26, which is very small in size, is provided integrally with the conductive foil 60, as shown in FIG. 5. Hence, there is a merit that the energy of bonding tool can be transferred, with greater bonding ability. In cutting the bonding wire after bonding, the bonding wire may be pull-cut. Then, since the bonding pad is integrated with the conductive foil 60, floating of the bonding pad can be suppressed, leading to better pull-cut ability.

Figure 7:
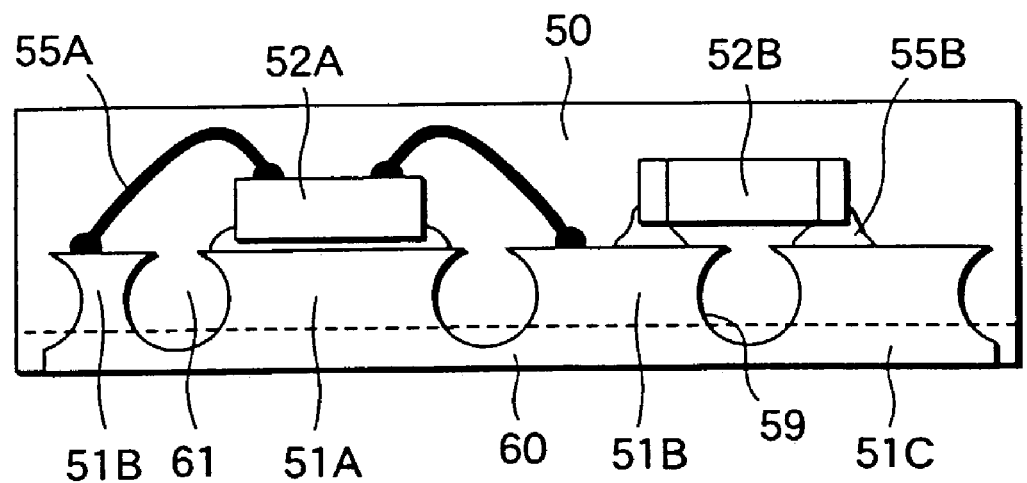
FIG. 7 is a view for explaining the method for manufacturing the circuit device of the invention.

Further, there is a step of attaching the insulating resin 50 onto the conductive foil 60 and the curved trench 61, as shown in FIG. 7. This can be performed by transfer molding, injection molding, dipping or application. The resin materials include a thermosetting resin such as epoxy resin for which the transfer molding is suitable, and a thermoplastic resin such as polyimide resin and polyphenylene sulfide for which the injection molding is usable.

In this embodiment, the insulating resin applied on the surface of the conductive foil 60 is adjusted so as to cover the thickness of about 100 µm from the top of the bonding wire 55A. This thickness may be increased or decreased in consideration of the strength of the circuit device.

A feature of this step is that the conductive foil 60, which becomes the conductive paths, serves as the support substrate up to being coated with the insulating resin 50. Conventionally, the support substrate 5 which is intrinsically not required is adopted to form the conductive paths 7 to 11, as shown in FIG. 26. In the present invention, the conductive foil 60 which becomes the support substrate is a necessary substance for the electrodes. Therefore, there is a merit that the operation can be effected by saving the material, with less cost.

The trench 61 has a smaller depth than the thickness of the conductive foil. Therefore, the conductive foil is not separated individually into the conductive paths. Accordingly, it can be treated integrally as one sheet conductive foil 60. It has a feature of the easy operation of carrying or mounting it onto the mold, when molding the insulating resin.

Further, since the insulating resin 50 is fitted into the trench 61 having the curved structure, there occurs the anchor effect in this region to prevent the insulating resin 50 from being peeled, and the conductive paths 51 from slipping off the insulating resin 50, the conductive paths 51 being separated at the later step.

Before coating this insulating resin 50, the silicone resin may be potted to protect the semiconductor chip or the connecting part of bonding wire, for example.

Subsequently, there is a step of removing chemically and/or physically the back face of the conductive foil 60 for separation into the conductive paths 51. This step of removing can be effected by polishing, grinding, etching, or metal evaporation using a laser irradiation.

In the experiments, the circuit device was cut about 30 μm thick over the entire surface by a polishing or grinding apparatus to expose the insulating resin 50 from the trench 61. This exposed face is indicated by the dot line in FIG. 7. As a result, each of the conductive paths 51 is about 40 μm thick. Before the insulating resin 50 is exposed, the conductive foil may be subjected to wet etching over the entire surface thereof. Then, the conductive foil may be cut over the entire surface by the polishing or grinding apparatus to expose the insulating resin 50. Further conductive path 51 can be separated by only wet etching step.

As a result, the conductive paths 51 are exposed from the insulating resin 50. And the trench 61 is cut, resulting in the trench 54 as shown in FIG. 1 (see FIG. 7).

Lastly, a conductive material such as solder 5D may be applied onto the second conductive paths 51 exposed, as required, to complete the circuit device as shown in FIG. 1.

Figure 3:
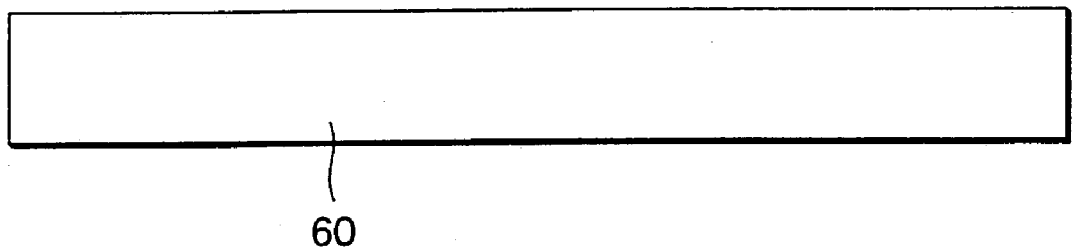
FIG. 3 is a view for explaining a method for manufacturing the circuit device of the invention.

In the case where the conductive material is coated on the back face of the conductive paths 51, the conductive coat may be formed ahead on the back face of the conductive foil of FIG. 3. In this case, the conductive coat may be selectively applied on the portion corresponding to the conductive path. The way of coating may be by plating. This conductive coat may be a material resistant to etching. When this conductive coat is adopted, the conductive paths 51 can be formed only by etching, without polishing.

With this manufacturing method, the transistor and the chip resistor are only mounted on the conductive foil 60, but may be arranged in a matrix of transistors and chip resistors, or a matrix of circuits as shown in FIG. 28. In this case, the matrix can be divided into individual units by using a dicing apparatus, as will be described later.

With this manufacturing method, the circuit device 56 of flat type can be fabricated in which the conductive paths 51 are buried into the insulating resin 50, and there is a common back face for the conductive paths 51 and the insulating resin 50.

A feature of this manufacturing method is that the insulating resin 50 is utilized as the support substrate and can be separated into the individual conductive paths.

The insulating resin 50 is required to have the conductive paths 51 buried therein. There is no need of having unnecessary support substrate 5, unlike the conventional manufacturing method of FIG. 26. Accordingly, it can be manufactured with the minimum amount of material, with less cost.

The thickness of the insulating resin from the surface of the conductive paths 51 can be adjusted when the insulating resin is attached at the previous step. Accordingly, the thickness of the circuit device 56 can be increased or decreased, depending on the circuit element to be mounted. Herein, in the circuit device, the conductive paths 51 having a thickness of 40 μm is buried into the insulating resin 50 having a thickness of 400 μm (see FIG. 1).

Second Embodiment for a Manufacturing Method of a Circuit Device

Referring to FIGS. 9 to 13 and FIG. 8, a manufacturing method of a circuit device 56 having a visor 58 will be described below. The second embodiment is substantially the same as the first embodiment (FIGS. 1 and 2), except that a second material 70 which serves as the visor is applied. The details are not described here.

Figure 9:
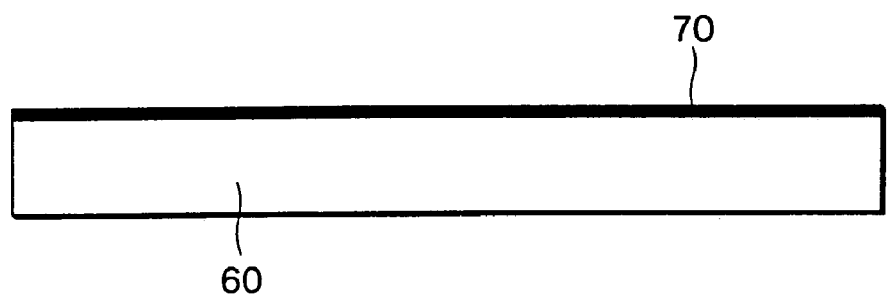
FIG. 9 is a view for explaining the method for manufacturing the circuit device of the invention.

Firstly, a laminated conductive foil 60 is prepared in which the second material 70 having a small etching rate is applied on the conductive foil 60 made of the first material, as shown in FIG. 9.

For example, if Ni is applied on the Cu foil, Cu and Ni can be etched by ferric chloride or cupric chloride at a time, advantageously resulting in the formation of the visor 58 of Ni, due to a difference between etching rates. The bold line indicates the conductive coat 70 made of Ni, its film thickness being preferably about 1 to 10 μm. The larger film thickness of Ni can form the visor 58 more easily.

The second material may cover the first material as well as the material for selective etching. In this case, the film made of the second material is firstly patterned to cover the formed area of the conductive paths 51. Then, with this film as a mask, the first material is etched so that the visor 58 can be formed. The second materials may include Al, Ag, Pd and Au (see FIG. 9).

Subsequently, there is a step of removing the conductive foil 60 except for at least the region which becomes the conductive paths 51 below the thickness of the conductive foil 60.

Figure 10:
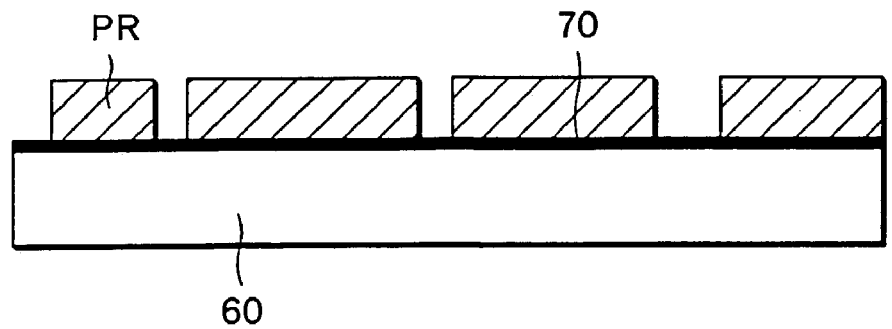
FIG. 10 is a view for explaining the method for manufacturing the circuit device of the invention.
Figure 11:
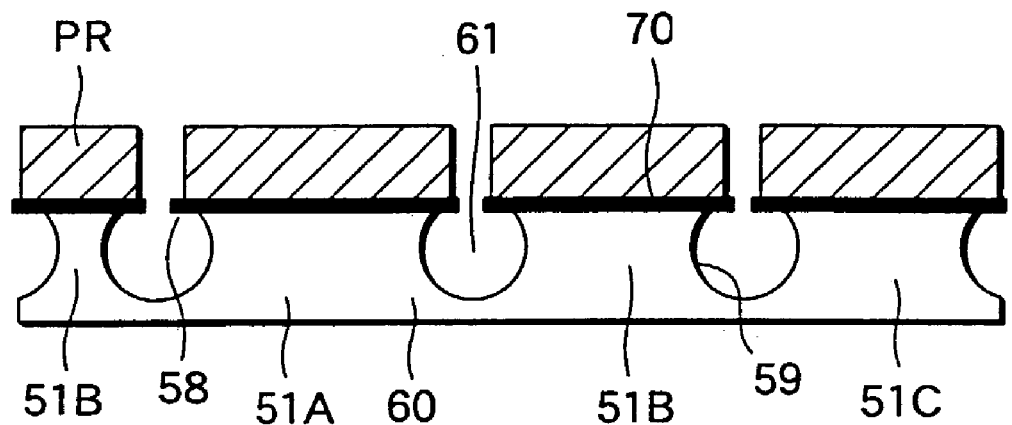
FIG. 11 is a view for explaining the method for manufacturing the circuit device of the invention.
Figure 12:
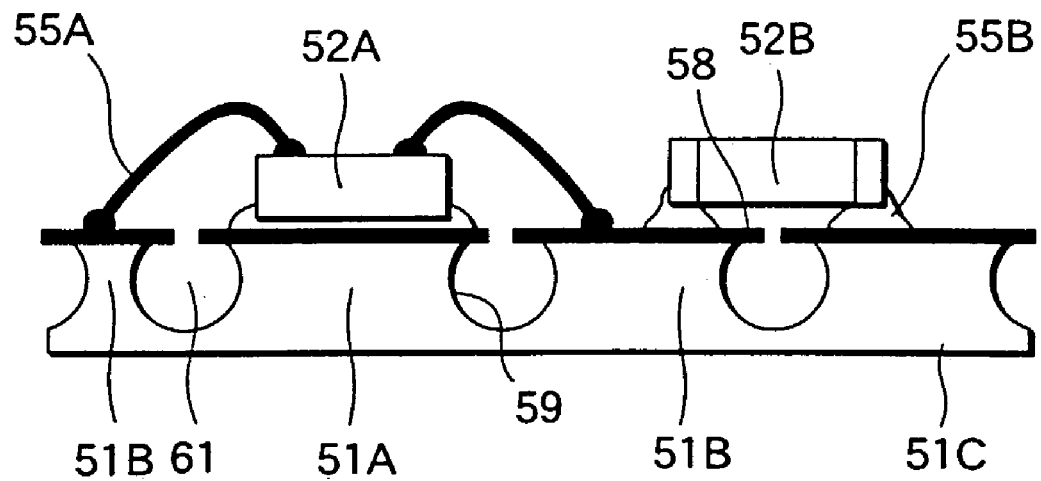
FIG. 12 is a view for explaining the method for manufacturing the circuit device of the invention.
Figure 13:
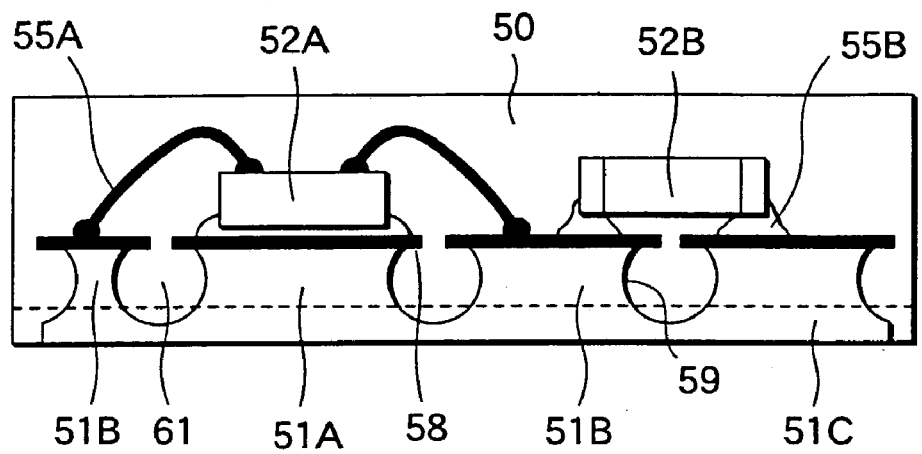
FIG. 13 is a view for explaining the method for manufacturing the circuit device of the invention.

The photo-resist PR is formed on the Ni conductive coat 70, and patterned so that the Ni conductive coat 70 may be exposed except for the region which becomes the conductive paths 51, as shown in FIG. 10. Then, etching is performed with the photo-resist, as shown in FIG. 11.

As described previously, if etching is performed, using an etchant such as ferric chloride or cupric chloride, the visor 58 juts out as the etching proceeds, because the Ni conductive coat 70 has a slower etching rate than the conductive foil Cu 60.

The steps of mounting the circuit elements 52 on the conductive foil 60 with the trench 61 formed (FIG. 12), covering the insulating resin 50 over the conductive foil 60 and the trench 61, removing the back face of the conductive foil 60 chemically and/or physically for separation into the conductive paths 51 (FIG. 13), and forming the conductive coat on the back face of the conductive paths to complete the circuit device (FIG. 8) are the same as those of the previous manufacturing method, and not described again.

Third Embodiment for a Manufacturing Method of a Circuit Device

Referring to FIGS. 14 to 20, a method for manufacturing a circuit device will be described below, in which the IC circuits having the conductive paths composed of a plurality of kinds of circuit elements, wires, die pads and bonding pads are arranged like a matrix and divided into individual IC circuits after sealing. Referring to FIG. 2 and particularly a cross-sectional view of FIG. 2C, the structure will be described below. This manufacturing method is substantially the same as in the first embodiment and the second embodiment, and is simply described.

Figure 14:
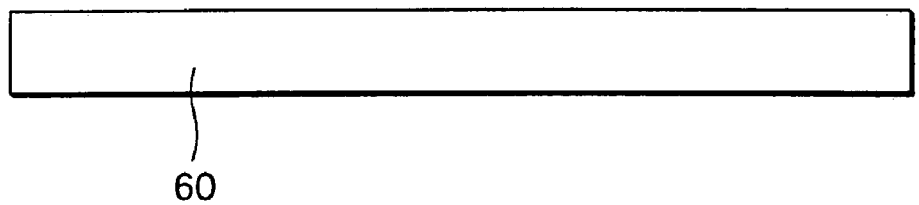
FIG. 14 is a view for explaining the method for manufacturing the circuit device of the invention.

Firstly, a sheet conductive foil 60 is prepared, as shown in FIG. 14.

The sheet conductive foil 60 is rolled in a predetermined width, and may be carried to the later process. Or the conductive foils cut in a predetermined size may be prepared and carried to the later process.

Subsequently, there is a step of removing the conductive foil 60 except for at least the region which becomes the conductive paths 51 below the thickness of the conductive foil 60.

Firstly, the photo-resist PR is made on the Cu foil 60, and patterned so that the conductive foil 60 may be exposed except for the region which becomes the conductive paths

Figure 15:
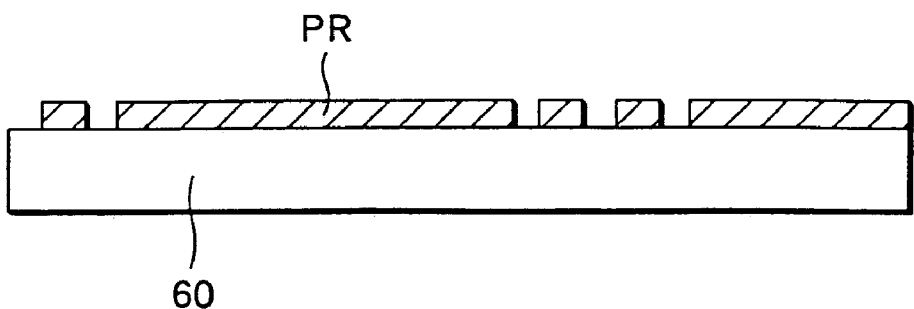
FIG. 15 is a view for explaining the method for manufacturing the circuit device of the invention.
Figure 16:
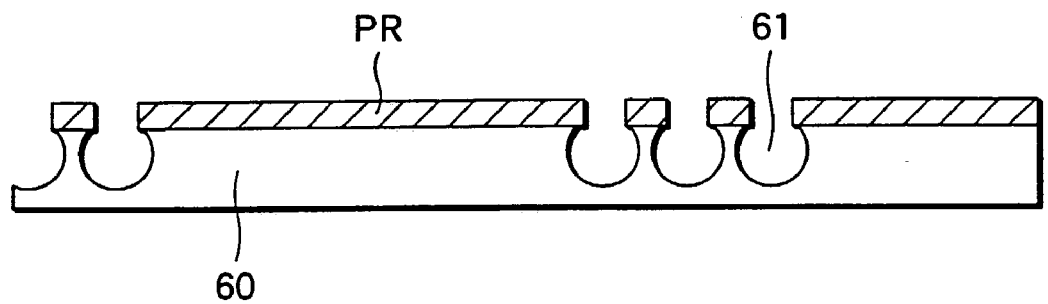
FIG. 16 is a view for explaining the method for manufacturing the circuit device of the invention.

51, as shown in FIG. 15. And etching is performed via the photo-resist PR, as shown in FIG. 16.

The trench 61 formed by etching is 50 μm in depth, for example, with its lateral face being rough, leading to increased adhesiveness of the insulating resin 50.

The lateral face of the trench 61 is etched non-anisotropically, and curved. This step of removing can be wet etching, or dry etching. This curved structure produces the anchor effect. (For more details, refer to the first embodiment for the manufacturing method of the circuit device.)

In FIG. 15, a conductive material which is resistant to the etching solution may be selectively coated, instead of the photo-resist PR. If it is selectively coated on the portion for the conductive paths, this conductive material serves as an etching protective film. As a result, the trench can be etched without the use of resist.

Figure 17:
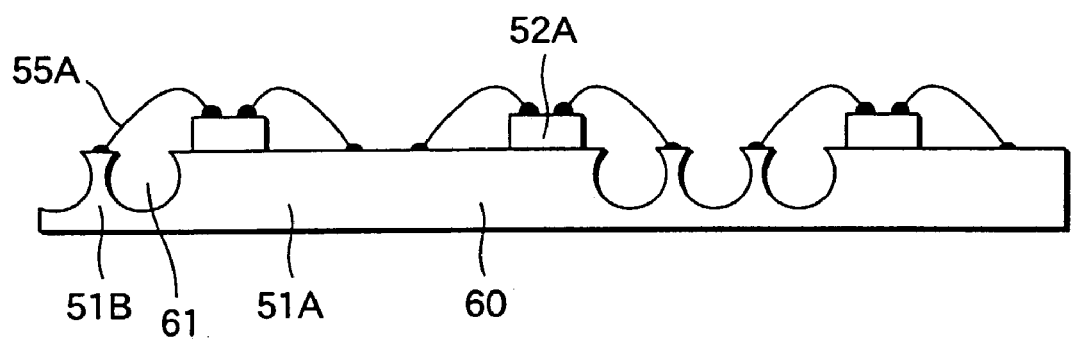
FIG. 17 is a view for explaining the method for manufacturing the circuit device of the invention.

Subsequently, there is a step of electrically connecting and mounting the circuit elements 52A to the conductive foil 60 formed with the trench 61, as shown in FIG. 17.

The circuit elements 52A include semiconductor devices such as a transistor, a diode, and an IC chip, and passive elements such as a chip capacitor and a chip resistor. Also, though being thicker, the face down semiconductor devices such as CSP and BGA may be mounted.

Herein, the bare transistor chip 52A is die bonded to the conductive path 51A. Consequently, the emitter electrode and the conductive path 51B, as well as the base electrode and the conductive path 51B are connected via the bonding wire 55A.

Figure 18:
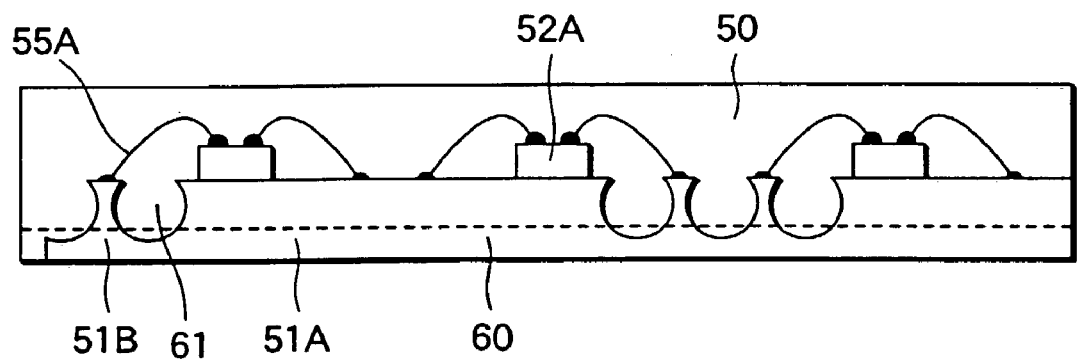
FIG. 18 is a view for explaining the method for manufacturing the circuit device of the invention.

Furthermore, there is a step of applying the insulating resin 50 to the conductive foil 60 and the trench 61, as shown in FIG. 18. This step can be performed by transfer molding, injection mold, or dipping.

In this embodiment, the insulating resin applied on the surface of the conductive foil 60 is adjusted to be about 100 μm thick from the top of the circuit elements mounted. This thickness can be made thicker or thinner in view of the strength of the circuit device.

A feature of this step is that the conductive foil 60, which becomes the conductive paths 51, serves as the support substrate, when coated with the insulating resin 50. Conventionally, the support substrate 5 which is intrinsically not required is used to form the conductive paths 7 to 11, as shown in FIG. 26. In the present invention, the conductive foil 60 which becomes the support substrate is a necessary substance for the electrodes. As a result, the manufacturing operation can be performed by saving the material, with less cost.

The trench 61 has a smaller depth than the thickness of the conductive foil. Therefore, the conductive foil is not separated individually into the conductive paths 51. Accordingly, it can be treated integrally as one sheet conductive foil 60. It has a feature of the easy operation of carrying or mounting it onto the mold, when molding the insulating resin.

Subsequently, there is a step of removing chemically and/or physically the back face of the conductive foil 60 for separation into the conductive paths 51. This step of removing can be effected by polishing, grinding, etching, or metal evaporation with laser.

In the experiments, the circuit device was cut about 30 μm thick over the entire surface by a polishing or grinding apparatus to expose the insulating resin 50. This exposed face is indicated by the dot line in FIG. 18. As a result, each of the conductive paths 51 is about 40 μm thick. Before the insulating resin 50 is exposed, the conductive foil 60 may be subjected to wet etching over the entire surface thereof.

Then, the conductive foil may be cut over the entire surface by the polishing or grinding apparatus to expose the insulating resin 50.

As a result, the surface of the conductive paths 51 is exposed from the insulating resin 50.

Figure 19:
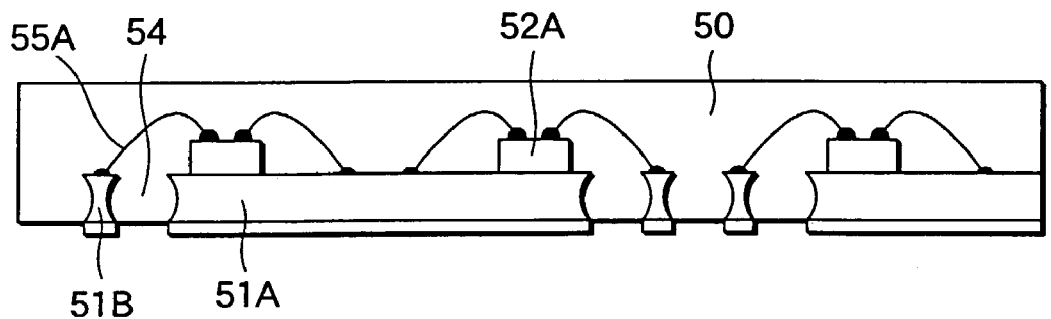
FIG. 19 is a view for explaining the method for manufacturing the circuit device of the invention.

Further, a conductive material such as solder is applied on the exposed conductive paths 51, as shown in FIG. 19.

Figure 20:
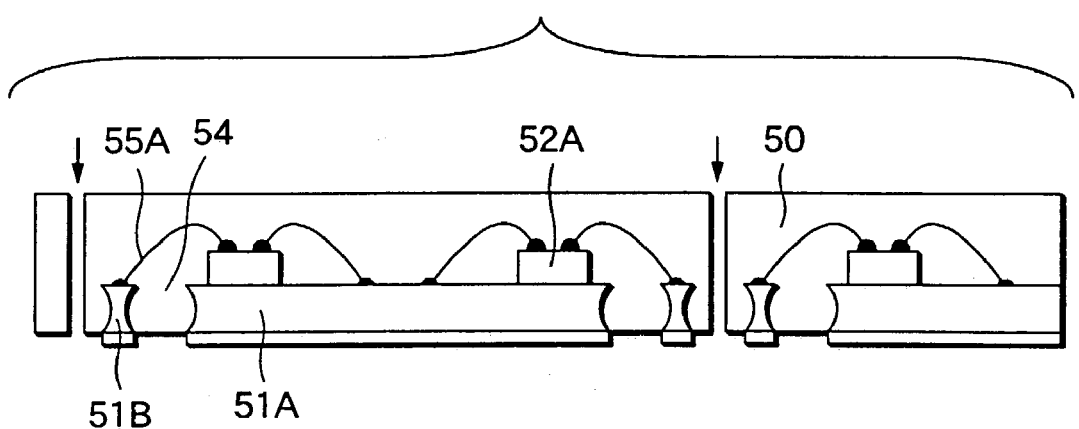
FIG. 20 is a view for explaining the method for manufacturing the circuit device of the invention.

Lastly, there is a step of completing the circuit device by separation into individual circuit elements, as shown in FIG. 20.

The separation line is indicated by the arrow, and separation can be effected by dicing, cut, press, or chocolate break. When using the chocolate break, a projection on the mold may be provided to form the groove at the separation line in coating the insulating resin.

Particularly, the dicing is mostly used in the manufacturing method of the semiconductor devices, and is preferable because it can cut very small things.

The manufacturing method as described in the first to third embodiments allows for the complex patterns, as shown in FIG. 28. Particularly, the wire is bent and integral with the bonding pad 26, the other end being electrically connected with the circuit element. The wire is narrow in width, and long. Therefore, the warp (curvature) caused by heat is very significant, resulting in exfoliation in the conventional structure. However, in the present invention, since the wires are buried into the insulating resin and supported, it is possible to prevent curvature, exfoliation and slippage of the wires. The bonding pad itself has a small plane area, and may be peeled in the conventional structure. However, since in the present invention, the bonding pad is buried into the insulating resin and supported by the insulating resin, with the anchor effect, there is a merit of preventing the slippage.

Further, there is another merit that the circuit device having the circuit elements buried into the insulating resin 50 can be produced. This is similar to the conventional structure in which the circuit is incorporated into a printed circuit board or a ceramic substrate. This will be described later in connection with a way of mounting.

Figure 27:
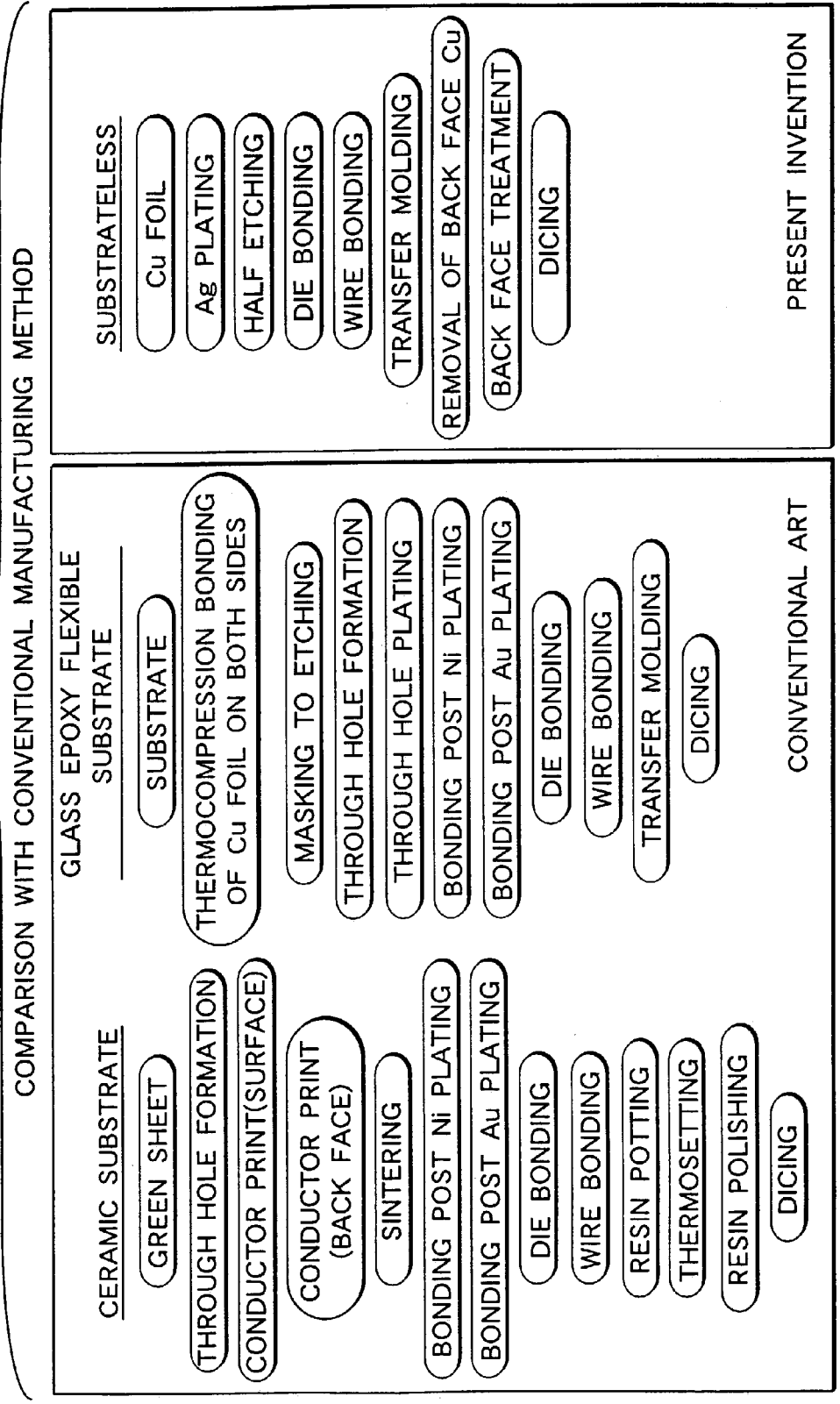
FIG. 27 is a view for explaining the method for manufacturing the conventional circuit device and the circuit device of the present invention.

To the right of FIG. 27, a simple flow diagram of the present invention is presented. The circuit device can be fabricated in accordance with the nine steps of preparing a Cu foil, plating with Ag or Ni, half etching, die bonding, wire bonding, transfer molding, removing the back face of Cu foil, treating the back face of conductive path, and dicing (dividing to a plurality of devices). And all the steps can be performed in the inside work without supplying the support substrate from the manufacturer.

Mode for Providing Various Kinds of Circuit Devices and the Ways of Mounting

FIG. 21 shows a circuit device 81 having a face down circuit element 80 mounted. The circuit element 80 is a bare semiconductor chip which have solder ball in the face, CSP or BGA having sealed surface. FIG. 22 shows a circuit device 83 having a passive element 82 such as a chip resistor mounted. They are of thin type because of no need of the support substrate. Also, they are sealed by the insulating resin, and superior in the environmental resistance.

Figure 23A:
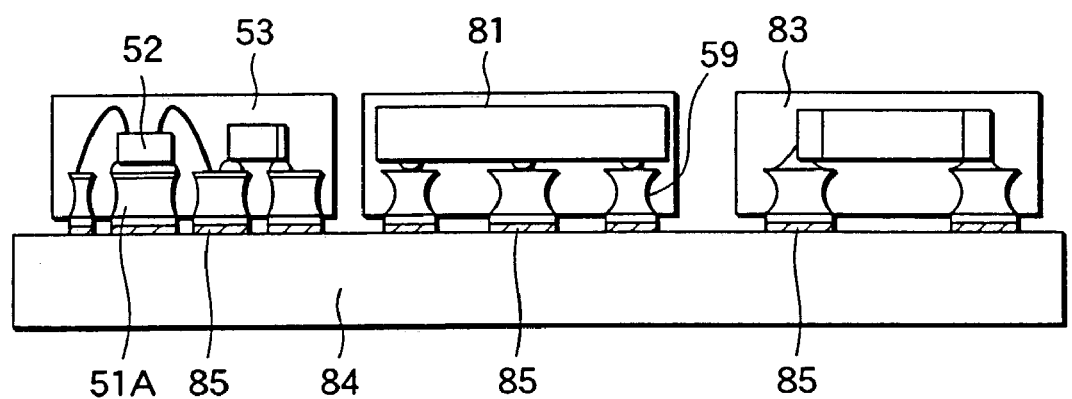
FIG. 23 is a view for explaining a way of mounting the circuit device of the invention.

FIG. 23 shows the mounting structure. Firstly, FIG. 23A shows the circuit devices 53, 81, and 83 as described above, which are mounted in the conductive paths 85 formed on a mounting substrate 84 such as a printed circuit board, metal substrate, or ceramic substrate.

Particularly, a conductive path 51A to which the back face of a semiconductor chip 52 is fixed is thermally coupled to the conductive paths 85 on the mounting substrate 84.

Therefore, the heat of the circuit device can be radiated via the conductive paths 85. If the metal substrate is used for the mounting substrate 84, the temperature of the semiconductor chip 52 can be further decreased, due to radiation of the metal substrate. Therefore, the driving capability of the semiconductor chip can be enhanced.

For example, the power MOS, IGBT, SIT, large current driving transistors, and large current driving IC (MOS, BIP, Bi-CMOS), memory IC are preferable.

The metal substrates preferably include an Al substrate, a Cu substrate and a Fe substrate. In view of the short-circuit with the conductive paths 85, the insulating resin and/or oxide films are formed.

Figure 23B:
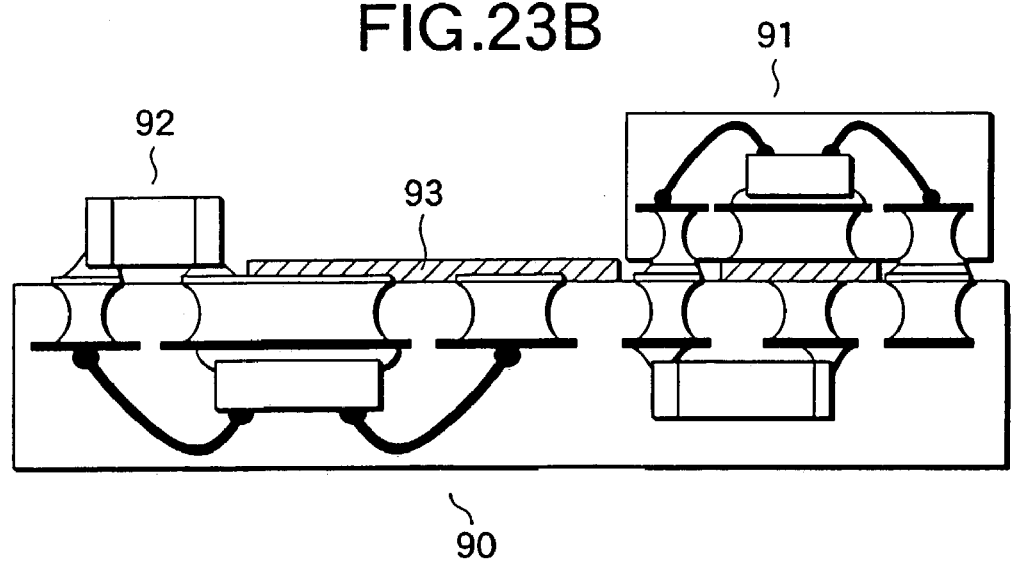
Figure 24:
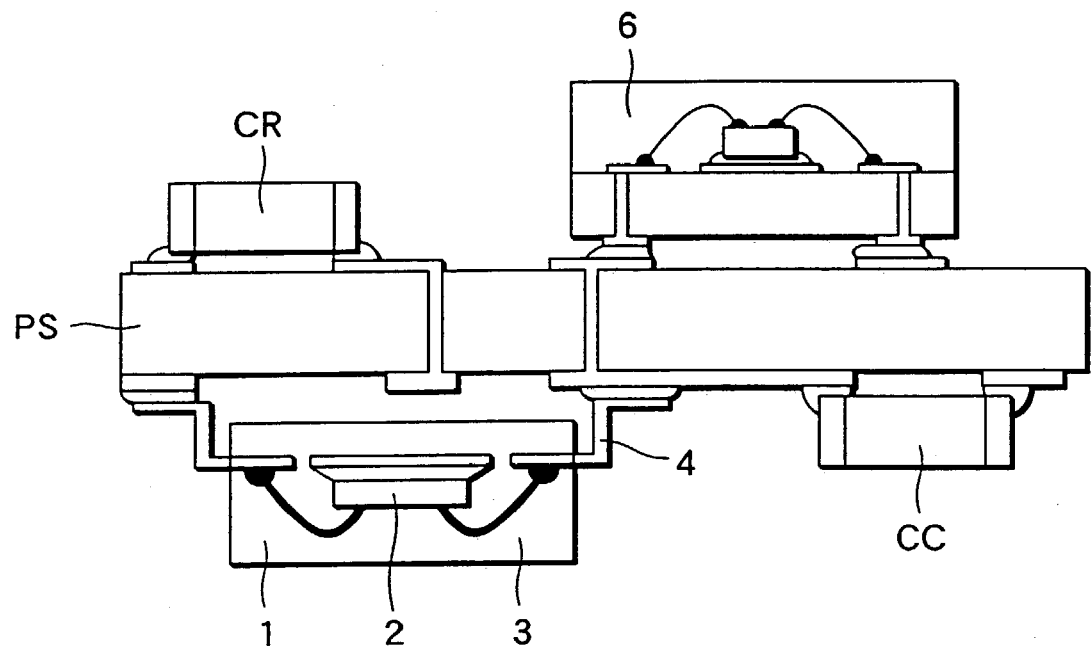
FIG. 24 is a view for explaining a mounting structure of the conventional circuit device.

FIG. 23B shows a circuit device 90 of the invention which is utilized as the substrate 84 of FIG. 23A. This is the greatest feature of the present invention. Namely, the conventional printed circuit board or ceramic substrate has a through hole TH formed in the substrate. In the present invention, a substrate module containing an IC circuit can be fabricated. For example, at least one circuit (which may be contained as the system) is contained in the printed circuit board.

Conventionally, the support substrate used the printed circuit board or ceramic substrate. In the present invention, the substrate module does not need the support substrate. This substrate module can be thinner and lighter than a hybrid substrate which may be the printed circuit board, the ceramic substrate, or the metal substrate.

This circuit device 90 is utilized as the support substrate, and the circuit elements can be mounted in the exposed conductive paths, resulting in a high performance substrate module. Particularly, if this circuit device is a support substrate and a circuit device 91 is mounted on the support substrate, the substrate module can be made further thinner and lighter.

Accordingly, according to the above embodiments, an electronic apparatus with this module mounted can be reduced in size and weight.

The hatching part indicated by numeral 93 is an insulating film. For example, a high molecular film such as solder resist is preferable. Due to formation of this film, it is possible to prevent the conductive paths buried into the substrate 90 and the electrodes formed on the circuit elements 91 from short-circuiting.

Referring to FIG. 29, there will be described some merits of the present circuit device in the following. In the conventional mounting method, the semiconductor manufacturers fabricated the package type semiconductor devices and flip chips. The set makers mounted the semiconductor devices supplied from the semiconductor manufacturers and the passive elements supplied from the parts makers on the printed circuit board and incorporated the circuit devices into the set to fabricate an electronic apparatus. However, since the circuit device of this invention allows itself to be used as the mounting substrate, the semiconductor manufacturers can complete the mounting substrate module in the later process, and deliver it to the set makers. Accordingly, the set makers can greatly save the operation of mounting the elements on the substrate.

As will be clearly understood, the present invention can fabricate the circuit devices with the conductive paths and the minimum amount of insulating resin, resulting in less wasteful resources. Hence, the circuit devices can be fabricated with less superfluous components up to completion, and with greatly reduced cost. The film thickness of insulating resin, and the thickness of conductive foil, can be optimized, to make the circuit device smaller, thinner and lighter. Furthermore, since the wires liable to curvature or exfoliation are buried into the insulating resin, those problems can be resolved.

Since the back face of conductive paths is exposed from the insulating resin, the back face of conductive paths can be directly contacted with the external. Hence, there is an advantage that the back face electrode and through hole of the conventional structure can be dispensed with.

When the circuit elements are directly fixed via the conductive coat made of the brazing material, Au or Ag, the heat developed by the circuit elements can be transferred directly via the conductive paths to the mounting substrate, because the back face of conductive paths is exposed. Particularly, the power elements can be also mounted, due to this heat radiation.

This circuit device has a flat plane structure in which the surface for the trench is substantially coincident with the surface for the conductive paths. If a narrow pitch QFP is mounted on the support substrate, the circuit device itself can be moved horizontally, as shown in FIG. 23B. Consequently, the lead shift can be easily modified.

Since the second material is formed on the surface of the conductive paths, the warping of the mounting substrate, or particularly the curvature or exfoliation of the fine slender wire can be prevented.

Since the conductive paths has the curved structure on the lateral face, and/or the second material is formed on the surface of conductive paths, a visor applied to a conductive path can be formed, bringing about the anchor effect to prevent the conductive paths from warping and slipping.

In the manufacturing method of the circuit device according to the present invention, the conductive foil itself serving as the conductive paths is utilized as the support substrate. The whole substrate is supported by the conductive foil, up to the steps of forming the trench or mounting the circuit elements and applying the insulating resin, while to divide the conductive foil into the conductive paths, the insulating resin is used as the support substrate. Accordingly, the circuit device of the invention can be manufactured with the least amount of circuit elements, conductive foil, and insulating resin, as required. As described in the conventional example, this circuit device can be fabricated without need of having the support substrate and with the reduced cost. Since the support substrate is unnecessary, the conductive paths are buried into the insulating resin, with the adjustable thickness of the insulating resin and the conductive foil, there is a merit that the circuit device can be made very thin. In forming the trench, the curved structure results, bringing about the anchor effect.

As will be apparent from FIG. 27, the steps of forming the through hole and printing the conductors (for the ceramic substrate) can be omitted. Therefore, the manufacturing process can be significantly shortened, and advantageously the whole process can be performed in the inside work. Also, the frame mold is unnecessary at all, leading to quite short delivery.

Since the conductive paths can be treated integrally, up to the step of removing the conductive foil (e.g., half etching), there is an advantage of the enhanced workability in the later step of coating the insulating resin.

Since there is a common face for the conductive paths and the insulating resin, the circuit device mounted can be moved without impact upon the lateral face of the conductive paths on the mounting substrate. Particularly, the circuit device mismounted can be redisposed by shifting it horizontally. If the brazing material is molten after mouting the circuit device, the circuit device mismounted will tend to get back onto the conductive path, owing to surface tension of the molten brazing material. Consequently, the reallocation of circuit device can be effected by itself.

Lastly, this circuit device can be utilized as the support substrate to mount the circuit elements in the exposed conductive paths, resulting in a substrate module with high performance. Particularly, if this circuit device is used as the support substrate and the circuit device 91 as the circuit element is mounted thereon, the substrate module can be made lighter and thinner.

What is claimed is:

1. A method of manufacturing a semiconductor module comprising:
   preparing a semiconductor device comprising:
   a plurality of conductive paths having a first face and a second face opposed to the first face,
   a first circuit element electrically connected to the first face of the conductive paths, wherein the first circuit element includes a semiconductor element and a passive element which are electrically connected by one or more of the conductive paths and are both located on a first side of the conductive paths, and
   an insulating resin supporting the conductive paths and the first circuit element, and having a first surface and a second surface with a shape substantially the same as the first surface, wherein each surface of the insulating resin except the first surface is only insulating resin; and
   an electrode formed by exposing the second face of the conductive paths from the first surface of the insulating resin;
   mounting a second circuit element on the electrode exposed at the first surface of the insulating resin as a mounting face; and
   providing an insulating film to cover the first surface but to expose a region of the electrode to be connected with the second circuit element.

2. The method of manufacturing a semiconductor module according to claim 1, wherein at least one of the first circuit element and the second circuit element is selected from at least one of a transistor, a diode, an IC, a chip capacitor, a chip resistor and a semiconductor package of CSP or BGA type.

3. The method of manufacturing a semiconductor module according to claim 1, wherein the semiconductor device further comprises a wiring, a plurality of the first circuit element and a plurality of the second circuit elements to constitute a circuit or system.

4. The method of manufacturing a semiconductor module according to claim 1 wherein the conductive paths are formed by forming one or more trenches in a conductive foil.

5. The method of manufacturing a semiconductor module according to claim 1 wherein the passive element is a chip capacitor.

6. The method of manufacturing a semiconductor module according to claim 1 wherein providing the insulating film to cover the first surface but to expose a region of the electrode to be connected with the second circuit element comprises providing a solder resist on at least a portion of an electrode exposed at the first surface.

7. A method of manufacturing a semiconductor module comprising:
   preparing a substrate including:
   a plurality of first circuit elements;
   a wiring connected to the first circuit elements; and
   an electrode electrically connected to the wiring, the first circuit elements and the wiring completely covered with an insulating resin and the electrode exposed from the insulating resin;
   an insulating film to cover a surface at which the electrode is exposed, but to expose a region of the electrode to be connected with a second circuit element,
   wherein the first circuit elements include a semiconductor element and a passive element which are electrically connected by the electrode and are both located on a first side of the electrode,
   wherein each surface of the substrate, except the surface at which the electrode is exposed, is only insulating resin; and
   mounting the second circuit element on the electrode.

8. The method of manufacturing a semiconductor module according to claim 7, further comprising:
   providing an insulating film to cover the first surface but to expose a region of the electrode to be connected with the second circuit element.

9. The method of manufacturing a semiconductor module according to claim 7, wherein at least one of the first circuit elements and the second circuit element is selected from at least one of a transistor, a diode, an IC, a chip capacitor, a chip resistor and a semiconductor package of CSP or BGA type.

10. The method of manufacturing a semiconductor module according to claim 7, wherein the semiconductor device further comprises a wiring, a plurality of the first circuit elements and a plurality of the second circuit elements to constitute a circuit or system.

* * * * *